(12) United States Patent
Park et al.

(10) Patent No.: US 11,521,544 B2
(45) Date of Patent: Dec. 6, 2022

(54) DISPLAY DEVICE

(71) Applicant: SAMSUNG DISPLAY CO., LTD., Yongin-si (KR)

(72) Inventors: Jong Won Park, Yongin-si (KR); Yang Wan Kim, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 17/697,222

(22) Filed: Mar. 17, 2022

(65) Prior Publication Data

US 2022/0301496 A1 Sep. 22, 2022

(30) Foreign Application Priority Data

Mar. 17, 2021 (KR) ........................ 10-2021-0034921

(51) Int. Cl.
*G09G 3/32* (2016.01)
(52) U.S. Cl.
CPC ....... *G09G 3/32* (2013.01); *G09G 2300/0426* (2013.01); *G09G 2310/08* (2013.01)
(58) Field of Classification Search
CPC ....... G09G 2300/0426; G09G 2310/08; G09G 3/32
See application file for complete search history.

(56) References Cited

U.S. PATENT DOCUMENTS

| 9,338,905 | B2 | 5/2016 | Ahn et al. |
| 10,504,442 | B2 | 12/2019 | Yoo |
| 10,861,393 | B2 | 12/2020 | Kim et al. |
| 10,930,724 | B2 | 2/2021 | Ka et al. |
| 2018/0308414 | A1* | 10/2018 | Kang .................. G09G 3/3685 |
| 2020/0184898 | A1* | 6/2020 | Choi .................... G09G 3/3233 |
| 2020/0388218 | A1* | 12/2020 | Han ..................... G09G 3/3233 |

FOREIGN PATENT DOCUMENTS

| KR | 1020180004369 A | 1/2018 |
| KR | 1020190003334 A | 1/2019 |
| KR | 101966739 B1 | 4/2019 |
| KR | 1020190034375 A | 4/2019 |
| KR | 1020200050204 A | 5/2020 |

* cited by examiner

*Primary Examiner* — Muhammad N Edun
(74) *Attorney, Agent, or Firm* — Cantor Colburn LLP

(57) ABSTRACT

A display device includes: a display panel including pixels connected to compensation gate lines, and a compensation gate driver which supplies compensation gate signals to the display panel. The compensation gate driver includes: a first compensation gate driver which generates the compensation gate signals based on a first-first clock signal and a second-first clock signal and a second compensation gate driver which generates the compensation gate signals based on a first-second clock signal and a second-second clock signal. The first-first clock signal and the second-first clock signal have the same waveform as the first-second clock signal and the second-second clock signal, respectively, during a scan period in which a compensation gate signal is supplied to the display panel, and have different waveforms from the first-second clock signal and the second-second clock signal, respectively, during a blank period in which the compensation gate signal is not supplied to the display panel.

18 Claims, 12 Drawing Sheets

<High Driving Frequency>

<Low Driving Frequency>

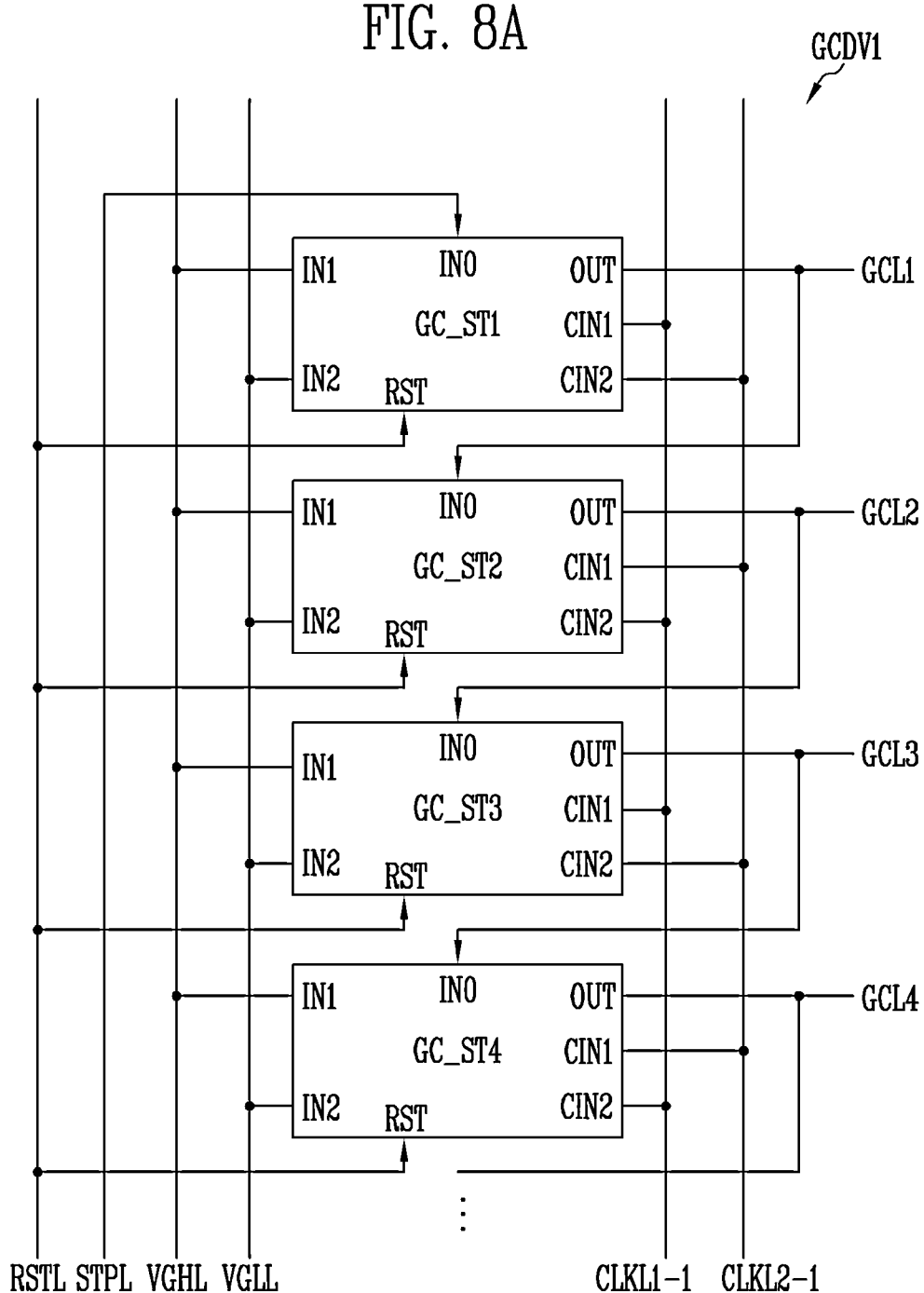

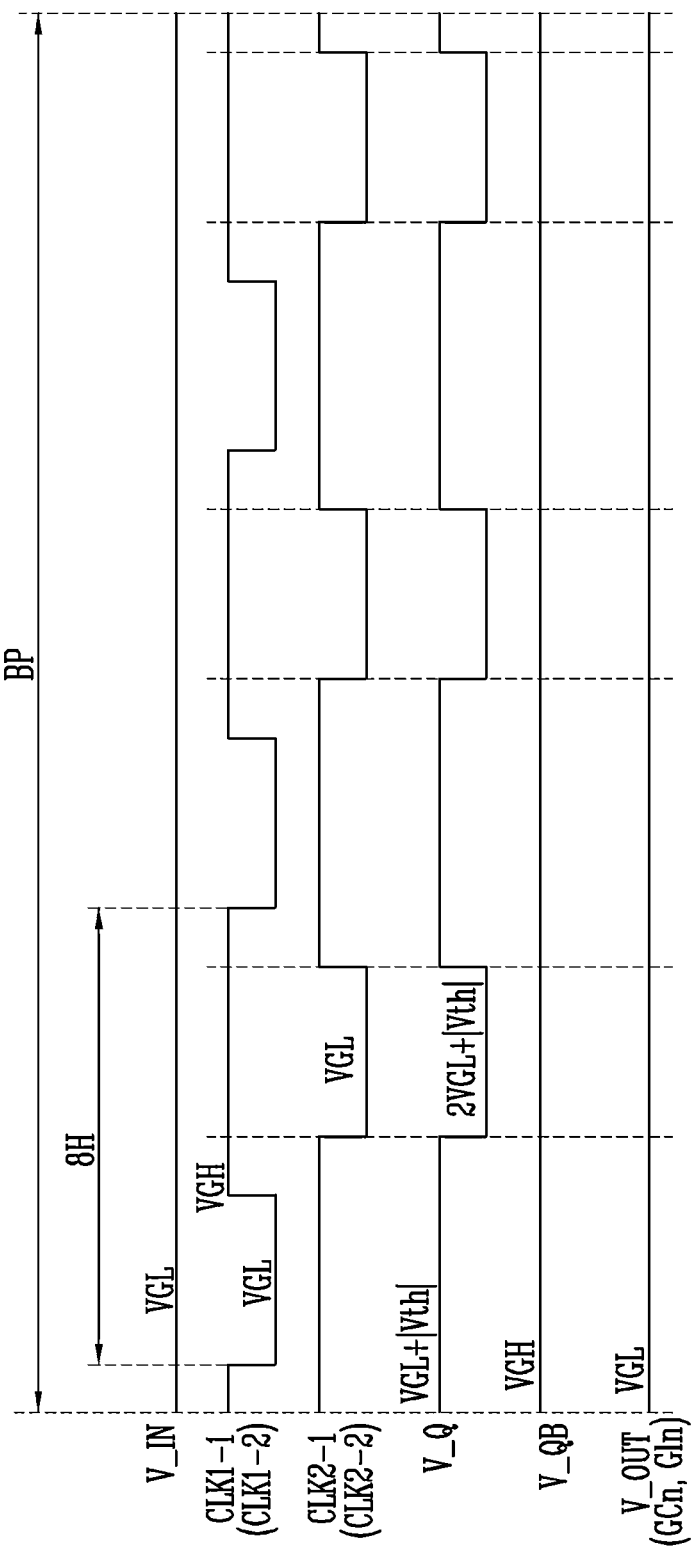

DISPLAY DEVICE

This application claims priority to Korean Patent Application No. 10-2021-0034921, filed on Mar. 17, 2021, and all the benefits accruing therefrom under 35 U.S.C. § 119, the content of which in its entirety is herein incorporated by reference.

BACKGROUND

1. Field

The present invention relates to a display device.

2. Description of the Related Art

A display device may include a data driver, a gate driver, and pixels. The data driver may provide data voltages to the pixels through data lines. The gate driver may generate a gate signal using a gate power source and a clock signal provided from outside, and sequentially provide the gate signal to the pixels through gate lines. For example, the gate driver may output the gate power source as the gate signal of a turn-on level in response to the clock signal. Each of the pixels may write a corresponding data voltage in response to the gate signal and emit light corresponding to the data voltage.

Each of the pixels may include an initialization transistor and a compensation transistor for compensating for a deviation in a threshold voltage of a driving transistor. The initialization transistor and the compensation transistor may be composed of an oxide semiconductor transistor. The oxide semiconductor transistor has a lower charge mobility than a polysilicon transistor, and thus, the amount of leakage current generated in a turned-off state can be minimized.

Meanwhile, the display device may be operated with a variable driving frequency. For example, the display device may be driven with a low driving frequency while displaying a still image, and may be driven with a high driving frequency while displaying a moving image. In order to reduce power consumption when driving at the low driving frequency, a cycle of the clock signal provided to the gate driver may be increased during a blank period in which a compensation gate signal for the initialization transistor and the compensation transistor is not supplied compared to a scan period in which the compensation gate signal is supplied.

SUMMARY

However, during the blank period, since a floating section at an output end of the gate driver becomes longer as the cycle of the clock signal provided to the gate driver becomes longer, there may be a problem in that a turn-off level of the compensation gate signal output from the gate driver increases.

A technical problem to be solved by the present invention is to provide a display device and a driving method thereof in which a compensation gate signal output from a gate driver to control an initialization transistor and a compensation transistor may be maintained at a turn-off level during a blank period.

Technical problems to be solved by the present invention are not limited to the above-described technical problem, and other technical problems that are not mentioned will be clearly understood by those skilled in the art from the following description.

In order to solve the above technical problems, a display device according to an embodiment of the present invention includes: a display panel including pixels connected to compensation gate lines; and a compensation gate driver which supplies compensation gate signals to the display panel. The compensation gate driver includes a first compensation gate driver which generates the compensation gate signals based on a first-first clock signal and a second-first clock signal and a second compensation gate driver which generates the compensation gate signals based on a first-second clock signal and a second-second clock signal. The first-first clock signal and the second-first clock signal may have the same waveform as the first-second clock signal and the second-second clock signal, respectively, during a scan period in which a compensation gate signal of the compensation gate signals is supplied to the display panel, and may have different waveforms from the first-second clock signal and the second-second clock signal, respectively, during a blank period in which the compensation gate signal is not supplied to the display panel.

In the blank period, the first-first clock signal may have a waveform in which the first-second clock signal is delayed by a half cycle, and the second-first clock signal may have a waveform in which the second-second clock signal is delayed by a half cycle.

A cycle of each of the first-first clock signal, the second-first clock signal, the first-second clock signal, and the second-second clock signal may be longer in the blank period than in the scan period.

The first compensation gate driver and the second compensation gate driver may sequentially generate the compensation gate signals of a turn-on level during the scan period, and maintain the compensation gate signals at a turn-off level during the blank period.

The compensation gate lines each may have one end connected to the first compensation gate driver and an opposite end connected to the second compensation gate driver, and the compensation gate signals may be simultaneously applied to the compensation gate lines from opposite sides of the display panel.

Each of the pixels may include a light emitting diode; a first-first transistor connected between a first power source and the light emitting diode; a second-first transistor connected between a data line and a first electrode of the first-first transistor; a third-first transistor connected between a gate electrode of the first-first transistor and a second electrode of the first-first transistor and having a gate electrode connected to a compensation gate line of the compensation gate lines; a fourth-first transistor connected between the gate electrode of the first-first transistor and an initialization power source and having a gate electrode connected to an initialization gate line; and a storage capacitor connected between the first power source and the gate electrode of the first-first transistor.

The display device may further include a fifth-first transistor connected between the first power source and the first electrode of the first-first transistor and having a gate electrode connected to an emission gate line; and a sixth-first transistor connected between the second electrode of the first-first transistor and an anode electrode of the light emitting diode and having a gate electrode connected to the emission gate line.

The display device may further include a seventh-first transistor connected between the initialization power source and the anode electrode of the light emitting diode and having a gate electrode connected to a bypass gate line.

The third-first transistor and the fourth-first transistor may be oxide semiconductor transistors.

The compensation gate line may be a current compensation gate line, and the initialization gate line may be a previous compensation gate line.

The display device may further include data lines connected to the pixels; and a data driver which supplies a data signal to the pixels through the data lines.

The compensation gate driver may include a plurality of stages which provides the compensation gate signals to the compensation gate lines. A stage of the plurality of stages may include a node control unit which controls a voltage of a first control node; and an output unit which outputs a first gate power source voltage supplied from a first power source input terminal as the compensation gate signals in response to the voltage of the first control node.

The output unit may include a pull-up transistor including a first electrode connected to the first power source input terminal, a second electrode connected to an output terminal, and a gate electrode connected to the first control node; and a pull-down transistor including a first electrode connected to the output terminal, a second electrode connected to a second power source input terminal which supplies a second gate power source voltage, and a gate electrode connected to a second control node.

The display device may further include a first clock signal line, a second clock signal line, and a start signal line. The node control unit may include a first transistor including a first electrode connected to the start signal line, a second electrode, and a gate electrode connected to the first clock signal line; a second transistor including a first electrode connected to the first power source input terminal, a second electrode, and a gate electrode; a third transistor including a first electrode connected to the second electrode of the second transistor, a second electrode connected to the second clock signal line, and a gate electrode connected to the second control node; a fourth transistor including a first electrode connected to the gate electrode of the second transistor, a second electrode connected to the first clock signal line, and a gate electrode connected to the second electrode of the first transistor; a fifth transistor including a first electrode connected to the first electrode of the fourth transistor, a second electrode connected to the second power source input terminal, and a gate electrode connected to the first clock signal line; a first coupling transistor including a first electrode connected to the first electrode of the fifth transistor, a second electrode, and a gate electrode connected to the second power source input terminal; a first coupling capacitor including a first electrode connected to the second electrode of the first coupling transistor and a second electrode; a sixth transistor including a first electrode connected to the first control node, a second electrode connected to the second electrode of the first coupling capacitor, and a gate electrode connected to the second clock signal line; and a seventh transistor including a first electrode connected to the second electrode of the first coupling capacitor, a second electrode connected to the second clock signal line, and a gate electrode connected to the first electrode of the first coupling capacitor.

The node control unit may further include a second coupling capacitor including a first electrode connected to the second electrode of the second transistor and a second electrode connected to the gate electrode of the third transistor; and a second coupling transistor including a first electrode connected to the second electrode of the first transistor, a second electrode connected to the second control node, and a gate electrode connected to the second power source input terminal.

The blank period may include a refresh period in which a signal having a voltage level lower than a turn-off level of the pull-down transistor is provided to the second control node; and a floating period in which a signal having a voltage level higher than the turn-off level of the pull-down transistor is provided to the second control node.

An odd-numbered stage among the stages may be in the refresh period when any one of voltage levels of the second-first clock signal and the second-second clock signal supplied through the second clock signal line during the blank period is at a logic low level, and may be in the floating period when both the voltage levels of the second-first clock signal and the second-second clock signal supplied through the second clock signal line during the blank period are at a logic high level.

An even-numbered stages among the stages may be in the refresh period when any one of voltage levels of the first-first clock signal and the first-second clock signal supplied through the first clock signal line during the blank period is at a logic low level, and may be in the floating period when both the voltage levels of the first-first clock signal and the first-second clock signal supplied through the first clock signal line during the blank period are at a logic high level.

BRIEF DESCRIPTION OF THE DRAWINGS

The accompanying drawings, which are included to provide a further understanding of the inventive concepts, and are incorporated in and constitute a part of this specification, illustrate embodiments of the inventive concepts, and, together with the description, serve to explain principles of the inventive concepts.

FIGS. 8A and 8B are diagrams illustrating an example of first and second compensation gate drivers included in the display device of FIG. 7.

FIG. 10B is a waveform diagram illustrating an example of signals measured during a blank period in the first compensation gate stage of FIG. 9.

DETAILED DESCRIPTION

Figure 1:
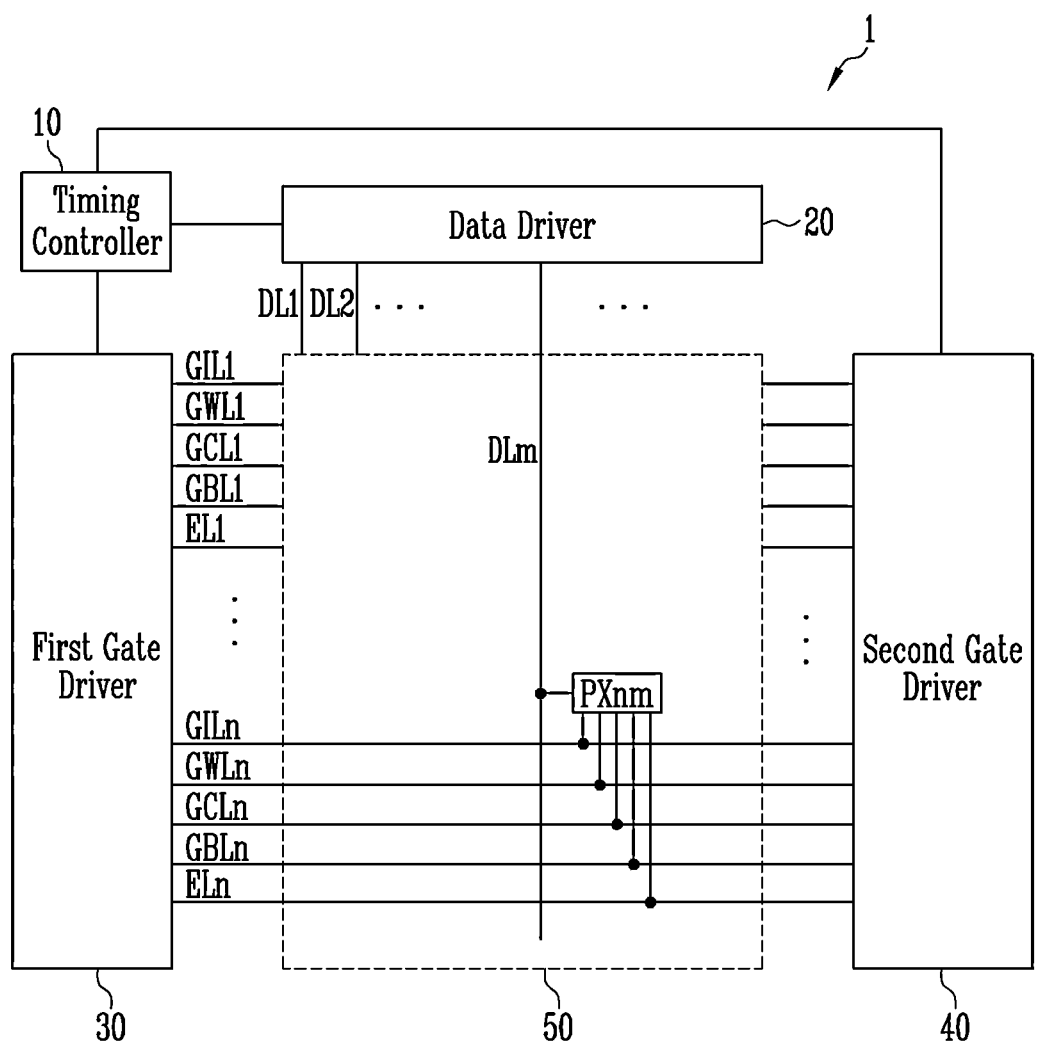
FIG. 1 is a diagram for explaining a display device according to an embodiment of the present invention.

Hereinafter, various embodiments of the present invention will be described in detail with reference to the accompanying drawings so that those of ordinary skill in the art may easily implement the present invention. The present invention may be embodied in various different forms and is not limited to the embodiments described herein.

In order to clearly describe the present invention, parts that are not related to the description are omitted, and the same or similar components are denoted by the same reference numerals throughout the specification. Therefore, the reference numerals described above may also be used in other drawings.

In addition, the size and thickness of each component shown in the drawings are arbitrarily shown for convenience of description, and thus the present invention is not necessarily limited to those shown in the drawings. In the drawings, thicknesses may be exaggerated to clearly express the layers and regions.

In addition, in the description, the expression "is the same" may mean "substantially the same". That is, it may be the same enough to convince those of ordinary skill in the art to be the same. In other expressions, "substantially" may be omitted.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

FIG. 1 is a diagram for explaining a display device according to an embodiment of the present invention.

Referring to FIG. 1, a display device 1 according to an embodiment may include a timing controller 10, a data driver 20, a first gate driver 30, a second gate driver 40, and a display panel 50.

The timing controller 10 may receive an external input signal from an external processor. The external input signal may include a vertical synchronization signal, a horizontal synchronization signal, a data enable signal, and RGB data signals.

The vertical synchronization signal may include a plurality of pulses, and may indicate that a previous frame period ends and a current frame period starts based on a time point at which each pulse is generated. An interval between adjacent pulses of the vertical synchronization signal may correspond to one frame period. The horizontal synchronization signal may include a plurality of pulses, and may indicate that a previous horizontal period ends and a new horizontal period starts based on a time point at which each pulse is generated. An interval between adjacent pulses of the horizontal synchronization signal may correspond to one horizontal period. The data enable signal may have an enable level for specific horizontal periods, and may have a disable level for the remaining periods. When the data enable signal is at the enable level, the data enable signal may indicate that an RGB data signal is supplied in corresponding horizontal periods. The RGB data signal may be supplied in units of pixel rows in each corresponding horizontal period. The timing controller 10 may generate grayscale values based on the RGB data signal to correspond to a specification of the display device 1. The timing controller 10 may generate control signals to be supplied to the data driver 20, the first gate driver 30, and the second gate driver 40 based on the external input signal to correspond to the specification of the display device 1.

The data driver 20 may generate data voltages to be provided to data lines DL1, DL2, and DLm using the grayscale values and the control signals received from the timing controller 10. For example, the data driver 20 may sample the grayscale values using a clock signal, and supply the data voltages corresponding to the grayscale values to the data lines DL1, DL2, and DLm in units of pixel rows (for example, pixels connected to the same gate line).

The gate drivers 30 and 40 may receive a clock signal, a gate start signal, a gate power source voltage, and the like from the timing controller 10 to generate gate signals to be provided to gate lines GIL1 GWL1, GCL1, GBL1, EL1, GILn, GWLn, GCLn, GBLn, and ELn, where n may be an integer greater than 0.

The gate drivers 30 and 40 may include a first gate driver 30 and a second gate driver 40. Each of the gate lines GIL1 GWL1, GCL1, GBL1, EL1, GILn, GWLn, GCLn, GBLn, and ELn may have one end connected to the first gate driver 30, and the other end connected to the second gate driver 40. The gate signals may be applied to the gate lines GIL1 GWL1, GCL1, GBL1, EL1, GILn, GWLn, GCLn, GBLn, and ELn from opposite sides of the display panel 50. Accordingly, RC delay of the gate signals can be minimized.

Each of the first and second gate drivers 30 and 40 may include a plurality of sub-gate drivers. For example, each of the sub-gate drivers may include a write gate driver, a compensation gate driver, and an emission gate driver. In addition, each of the sub-gate drivers may include a plurality of gate stages connected in the form of a shift register. For example, the gate signals may be generated by sequentially transferring a turn-on level pulse of the gate start signal supplied to a gate start line to the next gate stage. A detailed configuration of the first and second gate drivers 30 and 40 will be described later in detail with reference to FIGS. 7 to 9.

The display panel 50 may include a plurality of pixels. For example, a pixel PXnm may be connected to a corresponding data line DLm and gate lines GILn, GWLn, GCLn, GBLn, and ELn.

Figure 2:
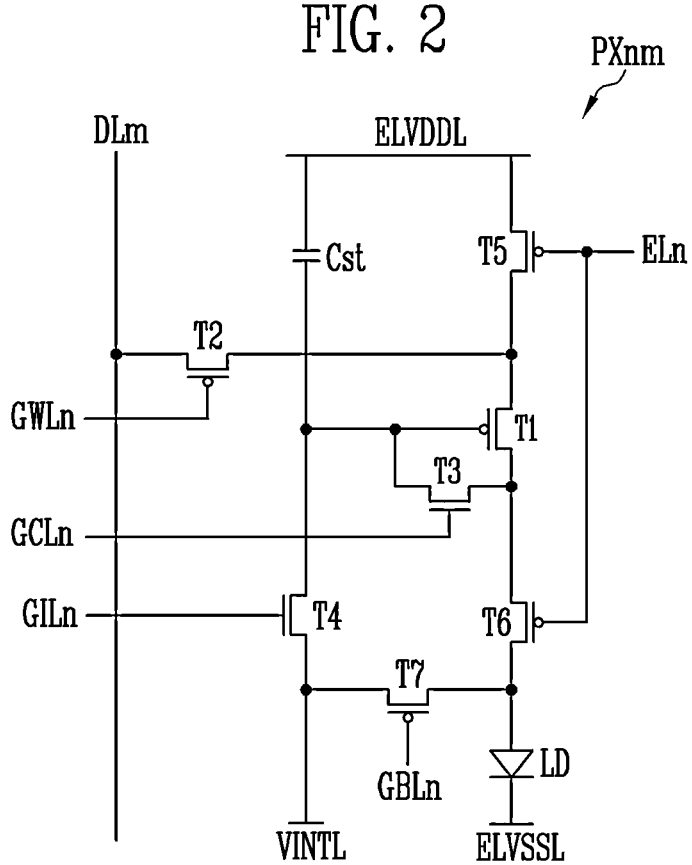
FIG. 2 is a diagram for explaining a pixel according to an embodiment of the present invention.

FIG. 2 is a diagram for explaining a pixel according to an embodiment of the present invention.

Referring to FIG. 2, the pixel PXnm according to an embodiment of the present invention may include transistors T1, T2, T3, T4, T5, T6, and T7, a storage capacitor Cst, and a light emitting diode LD.

A first transistor T1 may be connected between a first power source line ELVDDL and the light emitting diode LD. That is, a first electrode of the first transistor T1 may be connected to a second electrode of a second transistor T2, a second electrode of the first transistor T1 may be connected to a second electrode of a third transistor T3, and a gate electrode of the first transistor T1 may be connected to the second electrode of the third transistor T3. The first transistor T1 may be referred to as a driving transistor.

The second transistor T2 may be connected between a data line DLm and the first electrode of the first transistor T1. That is, a first electrode of the second transistor T2 may be connected to the data line DLm, the second electrode of the second transistor T2 may be connected to the first electrode of the first transistor T1, and a gate electrode of the second transistor T2 may be connected to a gate line GWLn (in other words, a write gate line). The second transistor T2 may be referred to as a gate transistor.

The third transistor T3 may be connected between the gate electrode of the first transistor T1 and the second electrode of the first transistor T1. That is, a first electrode of the third transistor T3 may be connected to the gate electrode of the first transistor T1, the second electrode of the third transistor T3 may be connected to the second electrode of the first transistor T1, and a gate electrode of the third transistor T3 may be connected to a gate line GCLn (in other words, a compensation gate line). The third transistor T3 may be referred to as a diode-connected transistor.

A fourth transistor T4 may be connected between the gate electrode of the first transistor T1 and an initialization power source line VINTL. That is, a first electrode of the fourth transistor T4 may be connected to the gate electrode of the first transistor T1 (or a second electrode of the capacitor Cst), a second electrode of the fourth transistor T4 may be connected to the initialization power source line VINTL, and a gate electrode of the fourth transistor T4 may be connected to a gate line GILn (in other words, an initialization gate line). The fourth transistor T4 may be referred to as a gate initialization transistor.

A fifth transistor T5 may be connected between the first power source line ELVDDL and the first electrode of the first transistor T1. That is, a first electrode of the fifth transistor T5 may be connected to the first power source line ELVDDL, a second electrode of the fifth transistor T5 may be connected to the first electrode of the first transistor T1, and a gate electrode of the fifth transistor T5 may be connected to a gate line ELn (in other words, an emission gate line). The fifth transistor T5 may be referred to as a first emission transistor.

A sixth transistor T6 may be connected between the second electrode of the first transistor T1 and the anode electrode of the light emitting diode LD. That is, a first electrode of the sixth transistor T6 may be connected to the second electrode of the first transistor T1, a second electrode of the sixth transistor T6 may be connected to the anode electrode of the light emitting diode LD, and a gate electrode of the sixth transistor T6 may be connected to the gate line ELn (in other words, the emission gate line). The sixth transistor T6 may be referred to as a second emission transistor.

A seventh transistor T7 may be connected between the initialization power source line VINTL and the anode electrode of the light emitting diode LD. That is, a first electrode of the seventh transistor T7 may be connected to the initialization power source line VINTL (or the second electrode of the fourth transistor T4), a second electrode of the seventh transistor T7 may be connected to the anode electrode of the light emitting diode LD, and a gate electrode of the seventh transistor T7 may be connected to a gate line GBLn (in other words, a bypass gate line). The seventh transistor T7 may be referred to as an anode initialization transistor.

The storage capacitor Cst may have a first electrode connected to the first power source line ELVDDL, and the second electrode connected to the gate electrode of the first transistor T1.

The light emitting diode LD may have the anode electrode connected to the second electrode of the sixth transistor T6 and a cathode electrode connected to a second power source line ELVSSL. A voltage applied to the second power source line ELVSSL may be set lower than a voltage applied to the first power source line ELVDDL. The light emitting diode LD may be an organic light emitting diode, an inorganic light emitting diode, a quantum dot light emitting diode, or the like.

Each of the first transistor T1, the second transistor T2, the fifth transistor T5, the sixth transistor T6, and the seventh transistor T7 may be a P-type transistor. Channels of the first transistor T1, the second transistor T2, the fifth transistor T5, the sixth transistor T6, and the seventh transistor T7 may include or be formed of poly silicon. A polysilicon transistor may be a low temperature poly silicon ("LTPS") transistor. The polysilicon transistor may have high electron mobility, and thus may have a fast driving characteristic.

Each of the third transistor T3 and the fourth transistor T4 may be an N-type transistor. Channels of the third transistor T3 and the fourth transistor T4 may be formed of an oxide semiconductor. An oxide semiconductor transistor may be manufactured by a low temperature process and may have lower charge mobility than the polysilicon transistor. Accordingly, the amount of leakage current generated in a turned-off state of the oxide semiconductor transistor may be smaller than that of the polysilicon transistor.

According to an embodiment, the seventh transistor T7 may be composed of an N-type oxide semiconductor transistor not the polysilicon transistor. In this case, one of the gate lines GCLn and GILn may be connected to the gate electrode of the seventh transistor T7 by replacing the gate line GBLn.

Figure 3:
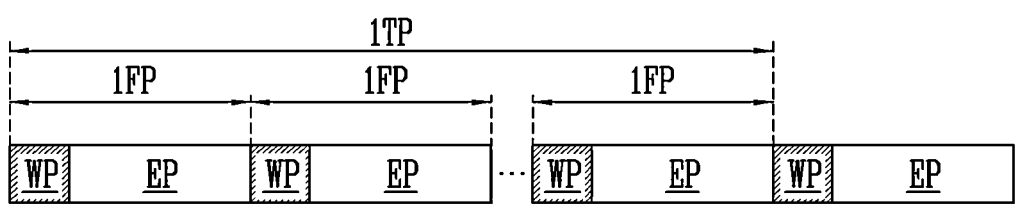
FIG. 3 is a diagram for explaining a high frequency driving method according to an embodiment of the present invention.

FIG. 3 is a diagram for explaining a high frequency driving method according to an embodiment of the present invention.

Referring to FIGS. 1 and 3, when the display panel 50 displays frames at a first driving frequency, it may be expressed that the display device 1 is in a first display mode. Also, when the display panel 50 displays frames at a second driving frequency less than the first driving frequency, it may be expressed that the display device 1 is in a second display mode.

In the first display mode, the display device 1 may display the images in image frames at 20 Hertz (Hz) or more, for example, 120 Hz.

The second display mode may be a low power display mode. The display device may display the images in image frames at less than 20 Hz, for example, 1 Hz. For example, an always-on mode in which only the time and date are displayed among commercial modes may correspond to the second display mode.

A period 1TP may include a plurality of frame periods 1FP. The period 1TP may be a period arbitrarily defined for comparing the first display mode and the second display mode. The period 1TP may mean the same time interval in the first display mode and the second display mode. For convenience of description, it is assumed that a frame period 1FP has the same time interval in the first display mode and the second display mode.

In the first display mode, the period 1TP may include the plurality of frame periods 1FP. Each of the frame periods 1FP may include a scan period WP and an emission period EP. For convenience of explanation, FIG. 3 shows that the scan period WP is positioned at the beginning of the frame period 1FP and the emission period EP is positioned after the scan period WP with respect to a first pixel row.

The pixel PXnm may display the images in a plurality of image frames corresponding to the number of frame periods 1FP during the period 1TP based on the data voltages received in scan periods WP.

Figure 4:
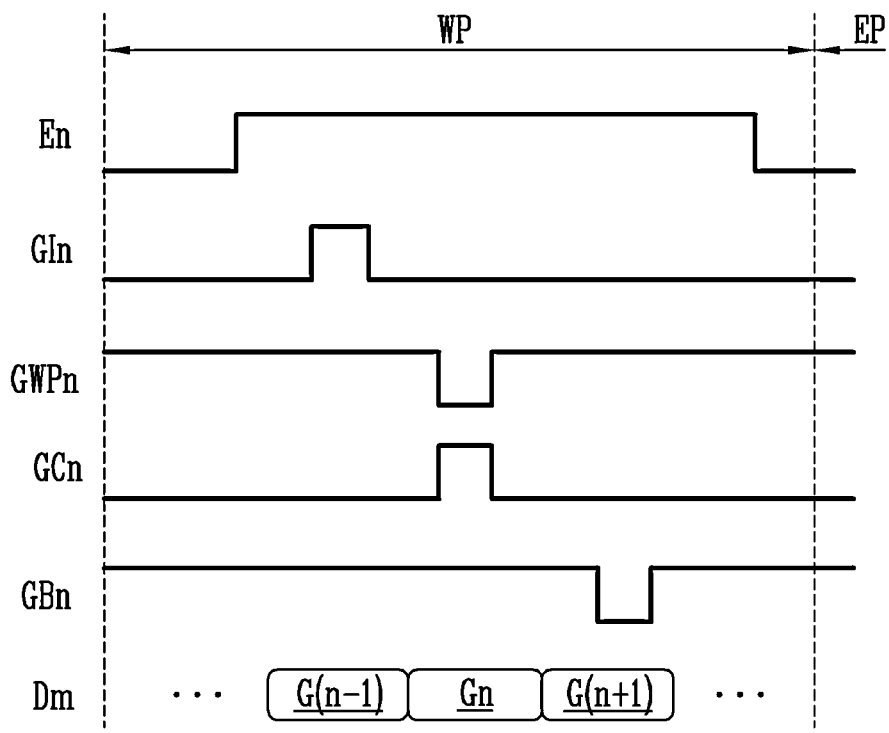
FIG. 4 is a diagram for explaining a scan period according to an embodiment of the present invention.

FIG. 4 is a diagram for explaining a scan period according to an embodiment of the present invention.

Hereinafter, a high-level pulse may be referred to as a rising pulse. When the rising pulse is supplied to a gate electrode of an N-type transistor, the N-type transistor may be turned on. That is, the rising pulse may be a turn-on level for the N-type transistor. Here, it is assumed that a voltage of a sufficiently low level compared to the gate electrode is applied to a source electrode of the N-type transistor. For example, the N-type transistor may be an NMOS transistor.

In addition, a low-level pulse may be referred to as a falling pulse. When the falling pulse is supplied to a gate electrode of a P-type transistor, the P-type transistor may be turned on. That is, the falling pulse may be a turn-on level for the P-type transistor. Here, it is assumed that a voltage of a sufficiently high level compared to the gate electrode is applied to a source electrode of the P-type transistor. For example, the P-type transistor may be a PMOS transistor.

Referring to FIGS. 1 to 4, first, an emission gate signal En of a turn-off level (high level) may be supplied to an emission gate line ELn during the scan period WP. Accordingly, the transistors T5 and T6 may be in a turned-off state during the scan period WP.

Next, an initialization gate signal GIn of a turn-on level (high level) may be supplied to an initialization gate line GILn. Accordingly, the fourth transistor T4 may be turned on, and the gate electrode of the first transistor T1 and the initialization power source line VINTL may be connected to each other. Accordingly, a voltage of the gate electrode of the first transistor T1 may be initialized to an initialization voltage of the initialization power source line VINTL, and may be maintained by the storage capacitor Cst. For example, the initialization voltage of the initialization power source line VINTL may be sufficiently lower than a voltage of the first power source line ELVDDL. For example, the initialization voltage may be a voltage having a level equal to or similar to a voltage of the second power source line ELVSSL. Accordingly, the first transistor T1 may be turned on.

Next, a write gate signal GWn of a turn-on level (low level) may be supplied to a write gate line GWLn, a compensation gate signal GCn of a turn-on level (high level) may be supplied to a compensation gate line GCLn, and the transistors T2 and T3 respectively corresponding to the write gate signal GWn and the compensation gate signal GCn may be turned on. Accordingly, a data voltage Dm corresponding to a grayscale value Gn of the pixel PXnm applied to the data line DLm may be written to the storage capacitor Cst through the transistors T2, T1, and T3. In this case, the data voltage Dm written to the storage capacitor Cst may be a voltage reflecting a decrease in a threshold voltage of the first transistor T1.

Next, a bypass gate signal GBn of a turn-on level (low level) may be supplied to a bypass gate line GBLn, and the seventh transistor T7 may be turned on. Accordingly, an anode voltage of the light emitting diode LD may be initialized.

Finally, when the emission gate signal En reaches a turn-on level (low level), the transistors T5 and T6 may be turned on. Accordingly, a driving current path connected through the first power source line ELVDDL, the transistors T5, T1, and T6, the light emitting diode LD, and the second power source line ELVSSL may be formed, and a driving current may flow. The amount of driving current may correspond to the data voltage Dm stored in the storage capacitor Cst. In this case, since the driving current flows through the first transistor T1, the decrease in the threshold voltage of the first transistor T1 may be reflected. Accordingly, since the decrease in the threshold voltage reflected in the data voltage Dm stored in the storage capacitor Cst and the decrease in the threshold voltage reflected in the driving current cancel each other, the driving current corresponding to the data voltage Dm may flow irrespective of a value of the threshold voltage of the first transistor T1. Depending on the amount of driving current, the light emitting diode LD may emit light with a desired luminance.

Figure 5:
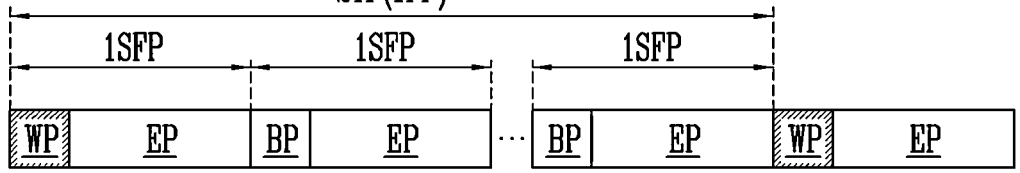
FIG. 5 is a diagram for explaining a low frequency driving method according to an embodiment of the present invention.

FIG. 5 is a diagram for explaining a low frequency driving method according to an embodiment of the present invention.

Referring to FIGS. 1 to 5, in the second display mode, a period 2TP may include one frame period 1FP, and one frame period 1FP may include a plurality of sub-frame periods 1SFP. Here, the number of sub-frame periods 1SFP included in the period 2TP may be the same as the number of frame periods 1FP included in the period 1TP shown in FIG. 3.

A first sub-frame period 1SFP may include a scan period WP and an emission period EP, and the remaining sub-frame periods 1SFP of the period 2TP may include a blank period BP and an emission period EP.

Since the transistors T3 and T4 of the pixel PXnm are maintained at the turned-off state in the remaining sub-frame periods 1SFP of the period 2TP, the storage capacitor Cst may maintain the same data voltage during a plurality of sub-frames. In particular, since the transistors T3 and T4 may be composed of oxide semiconductor transistors, leakage current can be effectively minimized.

Accordingly, the pixel PXnm may display the image in the same single image frame during the period 2TP based on the data voltage supplied in the scan period WP.

Figure 6:
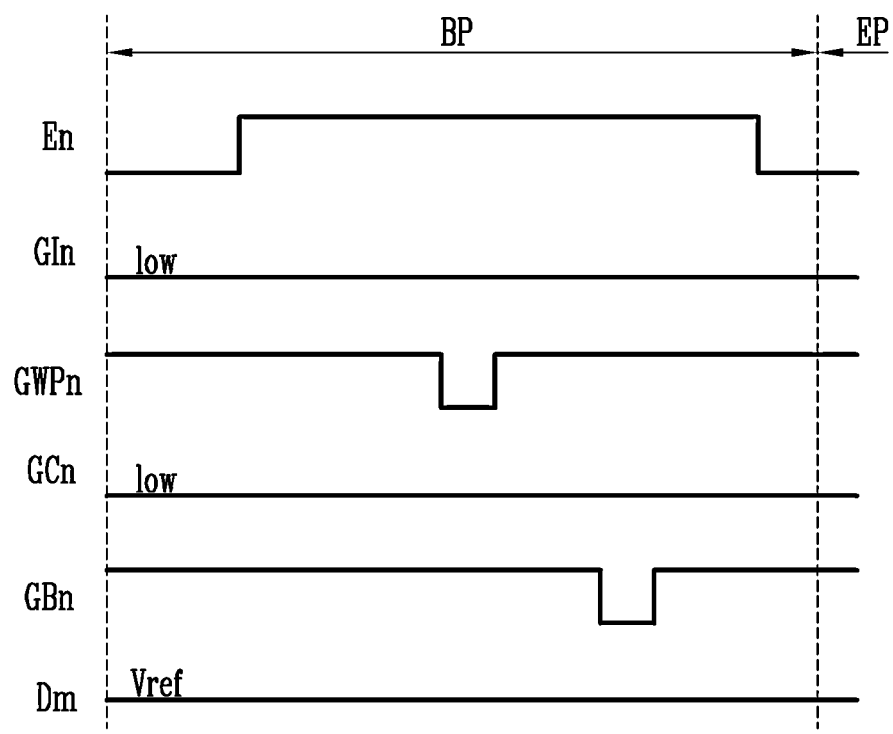
FIG. 6 is a diagram for explaining a blank period according to an embodiment of the present invention.

FIG. 6 is a diagram for explaining a blank period according to an embodiment of the present invention.

Referring to FIGS. 1 to 6, in the blank period BP, the initialization gate signal Gin and the compensation gate signal GCn of a turn-off level (low level) may be supplied. Accordingly, as described above, the data voltage written to the storage capacitor Cst in the blank period BP may not be changed. In this case, a reference data voltage Vref may be applied to the data line DLm.

However, in the blank period BP, the emission gate signal En, the write gate signal GWn, and the bypass gate signal GBn having the same waveform as in the scan period WP may be supplied. Accordingly, in the plurality of sub-frame periods 1SFP during low-frequency driving, a flicker may not be visually recognized by a user by making an emission waveform of the light emitting diode LD similar to that of high-frequency driving.

The period 1TP in which the display panel 50 is driven in the first display mode may be referred to as a first period (see FIG. 3). The period 1TP in which the display panel 50 is driven in the second display mode may be referred to as a second period (see FIG. 5). In this case, time intervals of the first period and the second period may be the same. That is, the number of frames included in the first period may be the same as the number of sub-frames included in the second period.

Figure 7:
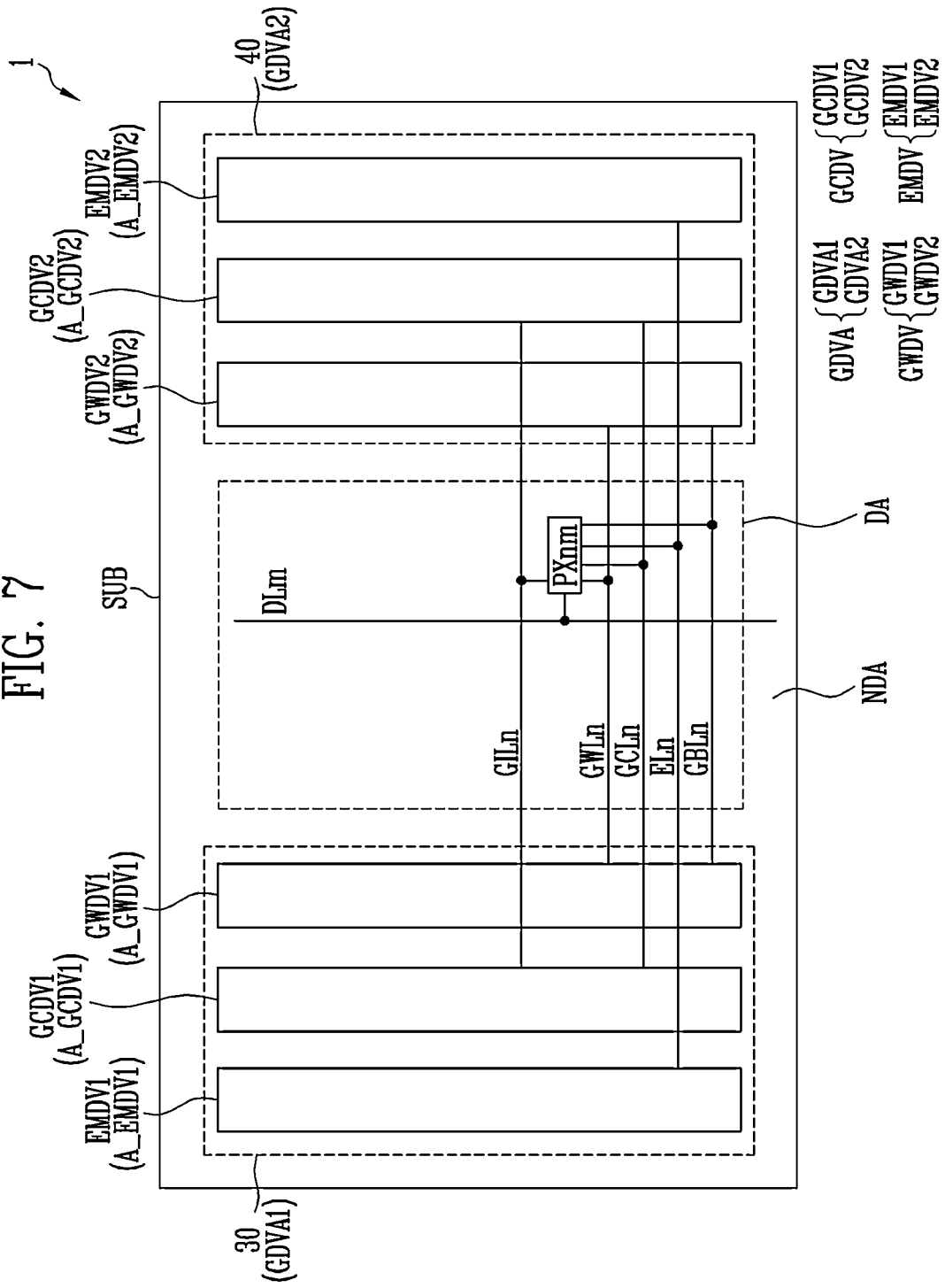
FIG. 7 is a plan view illustrating an example of the display device of FIG. 1.

FIG. 7 is a plan view illustrating an example of the display device of FIG. 1.

Referring to FIGS. 1 to 7, the display device 1 may include a substrate SUB.

The substrate SUB may include a display area DA and a non-display area NDA surrounding the display area DA. The non-display area NDA may include the first gate driver 30 (in other words, a first gate circuit area GDVA1) and the second gate driver 40 (in other words, a second gate circuit area GDVA2).

Data lines DLm, gate lines GWLn, GCLn, GBLn, GILn, and ELn, and pixels PXnm may be provided on the display area DA of the substrate SUB. The display area DA of the substrate SUB may correspond to the display panel 50 described with reference to FIG. 1.

The first gate driver 30 may be disposed on the first gate circuit area GDVA1 of the substrate SUB, and the second gate driver 40 may be disposed on the second gate circuit area GDVA2.

Each of the first and second gate drivers 30 and 40 may include a write gate driver GWDV, a compensation gate driver GCDV, and an emission gate driver EMDV. A gate circuit area GDVA of the substrate SUB may include write gate circuit areas A_GWDV1 and A_GWDV2, compensation gate circuit areas A_GCDV1 and A_GCDV2, and emission gate circuit areas A_EMDV1 and A_EMDV2 that are separated from each other. The write gate driver GWDV, the compensation gate driver GCDV, and the emission gate driver EMDV may be disposed or formed on the write gate circuit areas A_GWDV1 and A_GWDV2, the compensation gate circuit areas A_GCDV1 and A_GCDV2, and the emission gate circuit areas A_EMDV1 and A_EMDV2, respectively.

In an embodiment, the write gate driver GWDV may be closest to the display area DA. The compensation gate driver GCDV may be spaced apart from the display panel 50 than the write gate driver GWDV. The emission gate driver EMDV may be positioned to be spaced apart from the display area DA than the compensation gate driver GCDV. Since a pulse width of the write gate signal generated by the write gate driver GWDV is the smallest, the write gate signal may be most sensitive to RC (that is, resistance-capacitance) delay. Since a width of the emission gate signal generated by the emission gate driver EMDV is the largest, the emission gate signal may be least insensitive to the RC delay.

A first write gate driver GWDV1 may be in the form of a shift register and may include a plurality of write gate stages. In response to a write start signal received from the timing controller 10 (see FIG. 1), the write gate stages may sequentially generate write gate signals of a turn-on level (for example, a logic low level). The write gate signals GWn of the turn-on level (see FIG. 6) may be provided to corresponding write gate lines GWL1 to GWLn (see FIG. 1). According to an embodiment, the write gate signals GWn may be used as bypass gate signals GBn, and the write gate signals GWn of the turn-on level may also be provided to corresponding bypass gate lines GBL1 to GBLn (see FIG. 1). For example, a write gate signal (that is, a subsequent write gate signal) generated after the write gate signal GWn applied to the write gate line GWLn may be provided to the bypass gate line GBLn as the bypass gate signal GBn.

The second write gate driver GWDV2 may be substantially the same as or similar to the first write gate driver GWDV1 except for a position at which the second write gate driver GWDV2 is disposed. The write gate lines GWL1 to GWLn (see FIG. 1) may be connected to the first write gate driver GWDV1 and the second write gate driver GWDV2, and the write gate signals GWn may be applied to the write gate lines GWL1 to GWLn from opposite sides of the display area DA (or display panel 50). Accordingly, the RC delay of the write gate signals GWn can be minimized.

A first compensation gate driver GCDV1 (in other words, initialization gate driver) may be in the form of a shift register and may include a plurality of compensation gate stages (in other words, initialization gate stages).

In response to a compensation start signal (in other words, initialization start signal) received from the timing controller 10, the compensation gate stages may sequentially generate compensation gate signals GCn of a turn-on level (for example, a logic high level) based on a first-first clock signal and a second-first clock signal. The compensation gate signals GCn may be provided to corresponding compensation gate lines GCL1 to GCLn (see FIG. 1). According to an embodiment, the compensation gate signals GCn may be used as initialization gate signals GIn, and the compensation gate signals GCn of the turn-on level may also be provided to corresponding initialization gate lines GIL1 to GILn (see FIG. 1). For example, a compensation gate signal (that is, a previous compensation gate signal) generated before the compensation gate signal applied to the compensation gate line GCLn may be provided as the initialization gate signal to the initialization gate line GILn.

A second compensation gate driver GCDV2 may be substantially the same as or similar to the first compensation gate driver GCDV1 except for a position at which the second compensation gate driver GCDV2 is disposed and a clock signal based on it.

According to an embodiment, in response to the compensation start signal (in other words, initialization start signal) received from the timing controller 10, the compensation gate stages may sequentially generate the compensation gate signals GCn of the turn-on level (for example, the logic high level) based on a first-second clock signal and a second-second clock signal. The compensation gate signals GCn may be provided to the corresponding compensation gate lines GCL1 to GCLn (see FIG. 1).

The compensation gate lines GCL1 to GCLn (see FIG. 1) may be connected to the first compensation gate driver GCDV1 and the second compensation gate driver GCDV2, and the compensation gate signals GCn may be applied to the compensation gate lines GCL1 and GCLn from opposite sides of the display area DA (or display panel 50). Accordingly, the RC delay of the compensation gate signals GCn can be minimized.

Referring to FIG. 6, as described above, in an ideal case, the compensation gate signals GCn (or initialization compensation gate signals Gin) should be maintained at a turn-off level (logical low level) during the blank period BP. However, the turn-off level of the compensation gate signals GCn may rise due to a coupling phenomenon caused by various signals provided to the display panel 50 and/or a leakage current occurred in a turned-off state of transistors included in the compensation gate stage. Due to this, the amount of leakage current in a turned-off state of the third transistor T3 (or fourth transistor T4) of which on/off is controlled by the compensation gate signals GCn (or initialization compensation gate signals Gin) may also increase. In order to prevent the turn-off level of the compensation gate signals GCn from rising during the blank period BP, a driving method for differently controlling the clock signal provided to the first compensation gate driver GCDV1 and the clock signal provided to the second compensation gate driver GCDV2 will be described later in detail with reference to FIGS. 8A to 12.

The emission gate driver EMDV may be in the form of a shift register and may include a plurality of emission gate stages. In response to an emission start signal received from the timing controller 10 (see FIG. 1), the emission gate stages may sequentially generate emission gate signals of a turn-off level. The write gate signals of a turn-off level (for example, a logic high level) may be provided to corresponding emission gate lines EML1 to ELn (see FIG. 1).

A second emission gate driver EMDV2 may be substantially the same as or similar to a first emission gate driver EMDV1 except for a position at which the second emission gate driver EMDV2 is disposed. The emission gate lines EL1 to ELn (see FIG. 1) may be connected to the first emission gate driver EMDV1 and the second emission gate driver EMDV2, and emission gate signals En may be applied to the emission gate lines EL1 to ELn from opposite sides of the display area DA (or display panel 50). Accordingly, the RC delay of the emission gate signals En can be minimized.

Figure 8B:
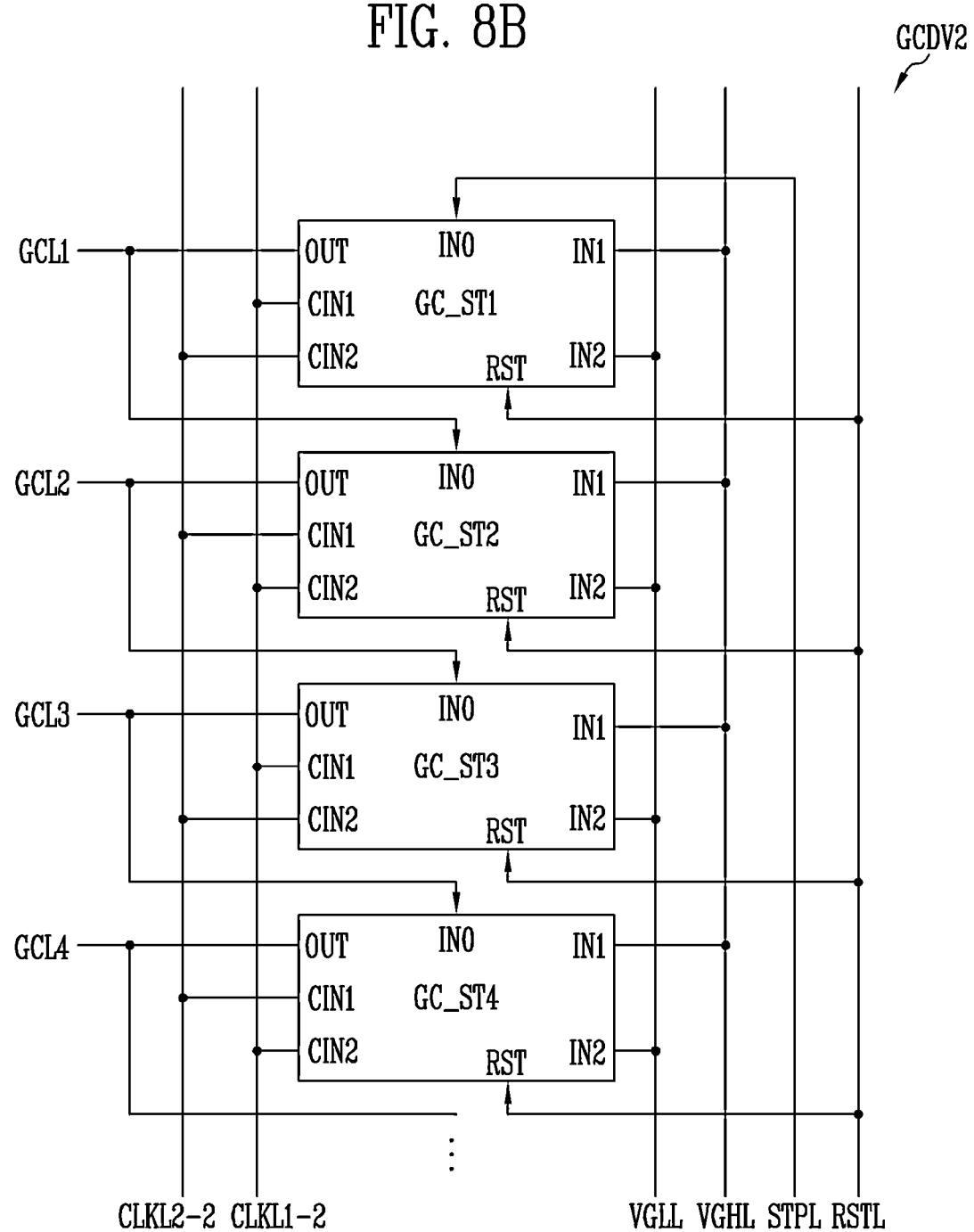

FIGS. 8A and 8B are diagrams illustrating an example of first and second compensation gate drivers included in the display device of FIG. 7.

Referring to FIGS. 7 and 8A, the first compensation gate driver GCDV1 may include a plurality of compensation gate stages GC_ST1, GC_ST2, GC_ST3, and GC_ST4 (or stages). FIG. 8A shows only a part of the first compensation gate driver GCDV1 for convenience of description.

Each of the compensation gate stages GC_ST1, GC_ST2, GC_ST3, and GC_ST4 may include an input terminal IN0, a first power source input terminal IN1, a second power source input terminal IN2, a first clock input terminal CIN1, a second clock input terminal CIN2, a reset terminal RST, and an output terminal OUT. As will be described later with reference to FIG. 9, internal circuit configurations of the compensation gate stages GC_ST1, GC_ST2, GC_ST3, and GC_ST4 may be substantially the same.

Each of the compensation gate stages GC_ST1, GC_ST2, GC_ST3, and GC_ST4 may be connected to a first gate power source line VGHL, a second gate power source line VGLL, clock signal lines CLKL1-1 and CLKL2-1, and a reset signal line RSTL. Here, a second gate power source voltage may be applied to the second gate power source line VGLL, and the second gate power source voltage may have a voltage level (for example, a logic low level) lower than a first gate power source voltage (for example, a logic high level) applied to the first gate power source line VGHL.

Clock signals (or compensation clock signals) may be applied to the clock signal lines CLKL1-1 and CLKL2-1 from the timing controller 10 (see FIG. 1). As will be described later with reference to FIG. 10A, the second-first clock signal (in other words, a second compensation clock signal) applied to a second-first clock signal line CLKL2-1 may be a signal in which the first-first clock signal (in other words, a first compensation clock signal) applied to a first-first clock signal line CLKL1-1 is delayed by a half cycle. A reset signal may be applied to the reset signal line RSTL from the timing controller 10 (see FIG. 1) when the display device 1 (see FIG. 1) is powered on and/or is powered off. Meanwhile, a start signal (a compensation start signal or a compensation start pulse) may be applied to a start signal line STPL from the timing controller 10.

For example, in odd-numbered compensation gate stages GC_ST1 and GC_ST3, the first power source input terminal IN1 may be connected to the first gate power source line VGHL, the second power source input terminal IN2 may be connected to the second gate power source line VGLL, the first clock input terminal CIN1 may be connected to the first-first clock signal line CLKL1-1, the second clock input terminal CIN2 may be connected to the second-first clock signal line CLKL2-1, and the reset terminal RST may be connected to the reset signal line RSTL.

In an embodiment, for example, in even-numbered compensation gate stages GC_ST2 and GC_ST4, the first power source input terminal IN1 may be connected to the first gate power source line VGHL, the second power source input terminal IN2 may be connected to the second gate power source line VGLL, the first clock input terminal CIN1 may be connected to the second-first clock signal line CLKL2-1, the second clock input terminal CIN2 may be connected to the first-first clock signal line CLKL1-1, and the reset terminal RST may be connected to the reset signal line RSTL.

Each of the compensation gate stages GC_ST1, GC_ST2, GC_ST3, and GC_ST4 may be connected to the start signal line STPL or the output terminal OUT of a previous compensation gate stage, and may generate the compensation gate signal corresponding to the start signal provided through the start signal line STPL and the previous compensation gate signal of the previous compensation gate stage.

In an embodiment, for example, the input terminal IN0 of a first compensation gate stage GC_ST1 may be connected to the start signal line STPL. The first compensation gate stage GC_ST1 may generate a first compensation gate signal corresponding to the start signal (for example, the start signal delayed by a half cycle of the clock signal) applied to the start signal line STPL. Also, the input terminal IN0 of a second compensation gate stage GC_ST2 may be connected to the output terminal OUT (or a first compensation gate line GCL1) of the first compensation gate stage GC_ST1. The second compensation gate stage GC_ST2 may generate a second compensation gate signal corresponding to the first compensation gate signal (for example, the first compensation gate signal delayed by a half cycle of the clock signal). Similarly, the input terminal IN0 of a third compensation gate stage GC_ST3 may be connected to the output terminal OUT (or a second compensation gate line GCL2) of the second compensation gate stage GC_ST2. The input terminal IN0 of a fourth compensation gate stage GC_ST4 may be connected to the output terminal OUT (or a third compensation gate line GCL3) of the third compensation gate stage GC_ST3.

That is, the compensation gate stages GC_ST1, GC_ST2, GC_ST3, and GC_ST4 may sequentially generate the compensation gate signals GCn (see FIG. 4) corresponding to the start signal. In some embodiments, each of the compensation gate stages GC_ST1, GC_ST2, GC_ST3, and GC_ST4 may output the compensation gate signal to compensation gate lines GCL1, GCL2, GCL3, and GCL4.

Referring to FIG. 8B, the second compensation gate driver GCDV2 may be substantially the same as the first compensation gate driver GCDV1 except for the waveform of the clock signal supplied to the plurality of compensation gate stages included in the second compensation gate driver GCDV2 is different from the waveform of the clock signal supplied to the plurality of compensation gate stages included in the first compensation gate driver GCDV1.

Specifically, each of the compensation gate stages GC_ST1, GC_ST2, GC_ST3, and GC_ST4 included in the second compensation gate driver GCDV2 may be connected to the first gate power source line VGHL, the second gate power source line VGLL, the clock signal lines CLKL1-2 and CLKL2-2, and the reset signal line RSTL.

The clock signals (or compensation clock signals) may be applied to the clock signal lines CLKL1-2 and CLKL2-2 from the timing controller 10 (see FIG. 1). As will be described later with reference to FIG. 10A, the second-second clock signal (in other words, the second compensation clock signal) applied to a second-second clock signal line CLKL2-2 may be a signal in which the first-second clock signal (in other words, the first compensation clock signal) applied to a first-second clock signal line CLKL1-2 is delayed by a half cycle.

In an embodiment, for example, in the odd-numbered gate stages GC_ST1 and GC_ST3, the first clock input terminal CIN1 may be connected to the first-second clock signal line CLKL1-2, and the second clock input terminal CIN2 may be connected to the second-second clock signal line CLKL2-2. In addition, in the even-numbered compensation gate stages GC_ST2 and GC_ST4, the first clock input terminal CIN1 may be connected to the second-second clock signal line CLKL2-2, the second clock input terminal CIN2 may be connected to the first-second clock signal line CLKL1-2, and the reset terminal RST may be connected to the reset signal line RSTL.

As will be described later with reference to FIG. 12, in the blank period BP, the first-first clock signal supplied through the first-first clock signal line CLKL1-1 of the first compensation gate driver GCDV1 may be a signal in which the first-second clock signal supplied through the first-second clock signal line CLKL1-2 of the second compensation gate driver GCDV2 is delayed by a half cycle. Similarly, in the blank period BP, the second-first clock signal supplied through the second-first clock signal line CLKL2-1 of the first compensation gate driver GCDV1 may be a signal in which the second-second clock signal supplied through the second-second clock signal line CLKL2-2 of the second compensation gate driver GCDV2 is delayed by a half cycle.

Figure 9:
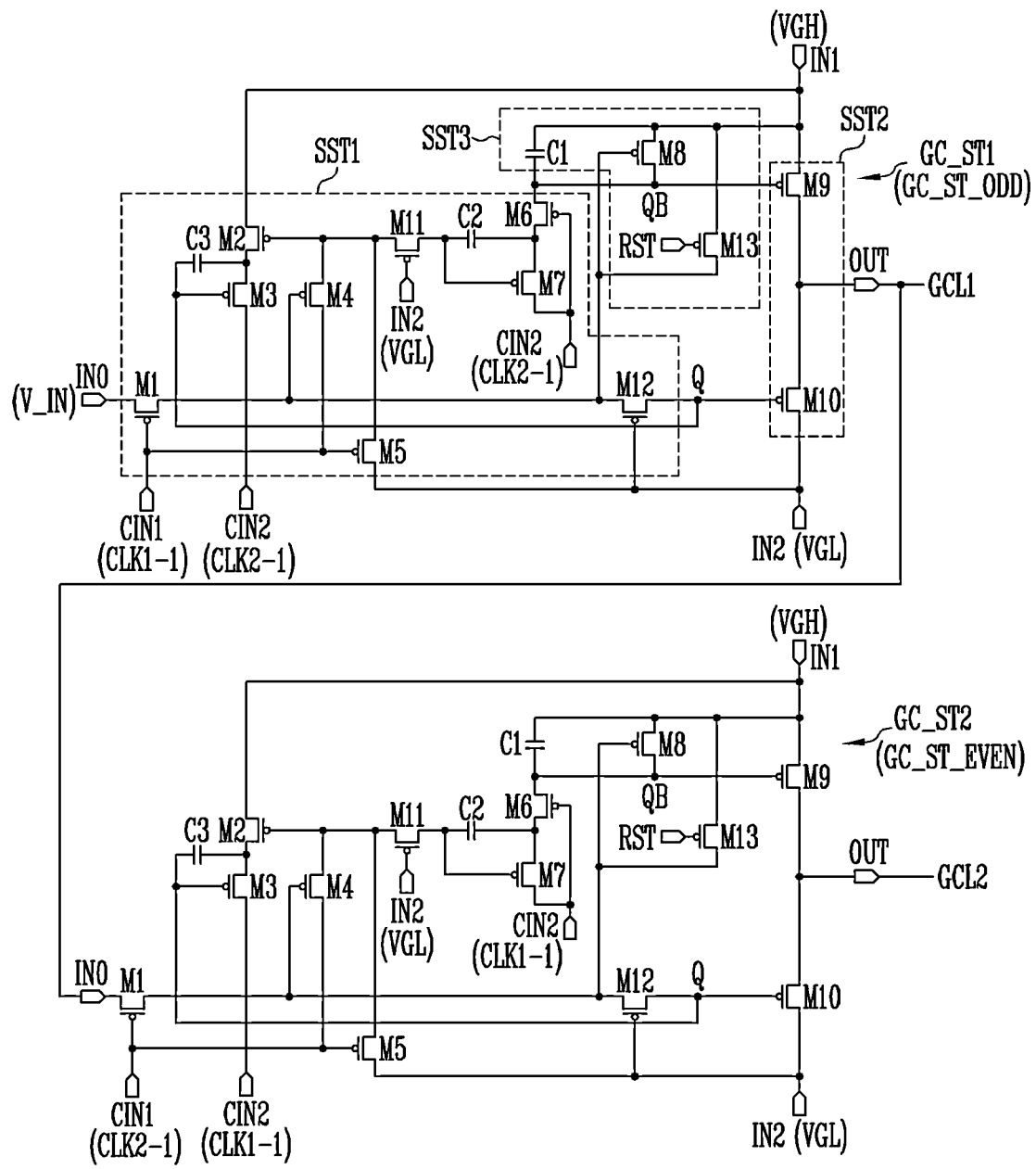
FIG. 9 is a circuit diagram illustrating an example of a first compensation gate stage and a second compensation gate stage included in a first compensation gate driver of FIG. 8A.

FIG. 9 is a circuit diagram illustrating an example of a first compensation gate stage and a second compensation gate stage included in a first compensation gate driver of FIG. 8A. Since an operation of the second compensation gate driver of FIG. 8B is substantially the same as the operation of the first compensation gate driver, duplicate descriptions will be omitted.

Each of the odd-numbered compensation gate stages GC_ST1 and GC_ST3 described with reference to FIG. 8A may be substantially the same as the first compensation gate stage GC_ST1, and each of the even-numbered compensation gate stages GC_ST2 and GC_ST4 may be substantially the same as the second compensation gate stage GC_ST2. Accordingly, the first compensation gate stage GC_ST1 and the second compensation gate stage GC_ST2 will be described as representative of the compensation gate stages GC_ST1, GC_ST2, GC_ST3, and GC_ST4.

Referring to FIGS. 8A and 9, in the first compensation gate stage GC_ST1, the first power source input terminal IN1 may be connected to the first gate power source line VGHL, the second power source input terminal IN2 may be connected to the second gate power source line VGLL, the first clock input terminal CIN1 may be connected to the first-first clock signal line CLKL1-1, the second clock input terminal CIN2 may be connected to the second-first clock signal line CLKL2-1, and the reset terminal RST may be connected to the reset signal line RSTL. A first gate power source voltage VGH may be applied to the first gate power source line VGHL, a second gate power source voltage VGL may be applied to the second gate power source line VGLL (and the second power source input terminal IN2), the first-first clock signal CLK1-1 may be applied to the first-first clock signal line CLKL1-1 (and the first clock input terminal CIN1), and the second-first clock signal CLK2-1 may be applied to the second-first clock signal line CLKL2-1 (and the second clock input terminal CIN2). A start signal V_IN may be applied to the input terminal IN0.

The first compensation gate stage GC_ST1 (or odd-numbered compensation gate stages GC_ST_ODD) may include a node control unit SST1, an output unit SST2 (in other words, buffer unit), and a node holding unit SST3.

First, the output unit SST2 may be connected to the first power source input terminal IN1 and the second power source input terminal IN2. The output unit SST2 may output the first gate power source voltage VGH as the first compensation gate signal to the output terminal OUT based on a voltage of a second control node Q and a voltage of a first control node QB.

The output unit SST2 may include a ninth transistor M9 (in other words, pull-up transistor) and a tenth transistor M10 (in other words, pull-down transistor).

The ninth transistor M9 may include a first electrode connected to the first power source input terminal IN1, a second electrode connected to the output terminal OUT, and a gate electrode connected to the first control node QB.

The tenth transistor M10 may include a first electrode connected to the output terminal OUT, a second electrode connected to the second power source input terminal IN2, and a gate electrode connected to the second control node Q.

The node control unit SST1 may be connected to the input terminal IN0, the second power source input terminal IN2, the first clock input terminal CIN1, and the second clock input terminal CIN2. The node control unit SST1 may control the voltage of the first control node QB and the voltage of the second control node Q using the start signal V_IN (in other words, the previous compensation gate signal) provided through the input terminal IN0.

The node control unit SST1 may include first, second, third, fourth, fifth, sixth, seventh, eleventh, and twelfth transistors M1, M2, M3, M4, M5, M6, M7, M11, and M12, a second capacitor C2 (in other words, first coupling capacitor), and a third capacitor C3 (in other words, second coupling capacitor).

A first transistor M1 may include a first electrode connected to the input terminal IN0, a second electrode connected to a first electrode of a twelfth transistor M12, and a gate electrode connected to the first clock input terminal CIN1.

A second transistor M2 may include a first electrode connected to the first power source input terminal IN1, a second electrode connected to a first electrode of a third transistor M3, and a gate electrode connected to a first electrode of an eleventh transistor M11.

The third transistor M3 may include the first electrode connected to the second electrode of the second transistor M2, a second electrode connected to the second clock input terminal CIN2, and a gate electrode connected to the second control node Q.

The third capacitor C3 may be disposed between the second electrode of the second transistor M2 and the second control node Q, and may include a first electrode connected to the second electrode of the second transistor M2 and a second electrode connected to the second control node Q.

A fourth transistor M4 may include a first electrode connected to the gate electrode of the second transistor M2, a second electrode connected to the first clock input terminal CIN1, and a gate electrode connected to the second electrode of the first transistor M1.

A fifth transistor M5 may include a first electrode connected to the gate electrode of the second transistor M2, a second electrode connected to the second power source input terminal IN2, and a gate electrode connected to the first clock input terminal CIN1.

A sixth transistor M6 may include a first electrode connected to the first control node QB, a second electrode connected to a first electrode of a seventh transistor M7, and a gate electrode connected to the second clock input terminal CIN2.

The seventh transistor M7 may include the first electrode connected to the second electrode of the sixth transistor M6, a second electrode connected to the second clock input terminal CIN2, and a gate electrode connected to a second electrode of the eleventh transistor M11.

The second capacitor C2 (in other words, first coupling capacitor) may be disposed between the second electrode of the eleventh transistor M11 and the second electrode of the sixth transistor M6, and may include a first electrode connected to the second electrode of the eleventh transistor M11 and a second electrode connected to the second electrode of the sixth transistor M6.

The eleventh transistor M11 (in other words, a first coupling transistor) may include a first electrode connected to the gate electrode of the second transistor M2, a second electrode connected to the first electrode of the second capacitor C2, and a gate electrode connected to the second power source input terminal IN2.

The twelfth transistor M12 (in other words, a second coupling transistor) may include the first electrode connected to the second electrode of the first transistor M1, a second electrode connected to the second control node Q, and a gate electrode connected to the second power source input terminal IN2.

The node holding unit SST3 may constantly maintain the voltage of the first control node QB in response to the voltage of the second control node Q. The node holding unit SST3 may include a first capacitor C1, an eighth transistor M8, and a thirteenth transistor M13.

The first capacitor C1 may be disposed between the first power source input terminal IN1 and the first control node QB, and may include a first electrode connected to the first power source input terminal IN1 and a second electrode connected to the first control node QB. The first capacitor C1 may maintain a constant voltage difference between the first power source input terminal IN1 and the first control node QB.

The eighth transistor M8 may include a first electrode connected to the first power source input terminal IN1, a second electrode connected to the first control node QB, and a gate electrode connected to the second electrode of the first transistor M1. The eighth transistor M8 may maintain the voltage of the first control node QB constant in response to a voltage of the second electrode of the first transistor M1 (that is, the voltage of the second control node Q). For example, when the voltage of the second control node Q has a logic low level, the eighth transistor M8 may maintain the voltage of the first control node QB at a logic high level by using the first gate power source voltage VGH.

The thirteenth transistor M13 (in other words, a reset transistor) may include a first electrode connected to the first power source input terminal IN1, a second electrode connected to the second electrode of the first transistor M1, and a gate electrode connected to the reset terminal RST. When the display device 1 (see FIG. 1) is turned on or turned off, a reset operation in which the reset signal of a logic low level is applied to the reset terminal RST, the thirteenth transistor M13 is turned on in response to the reset signal of the logic low level, and a voltage of the second electrode of the first transistor M1 (and the second control node Q) has the first gate power source voltage VGH may be performed.

The first to thirteenth transistors M1 to M13 may be P-type transistors. In FIG. 9, the first to thirteenth transistors M1 to M13 are shown as single gate transistors, but the present invention is not limited thereto. For example, in order to improve reliability, at least one of the first to thirteenth transistors M1 to M13 may be implemented as a dual gate transistor (that is, a dual gate transistor composed of two transistors connected in series, and having gate electrodes connected to each other).

The second compensation gate stage GC_ST2 (or even-numbered compensation gate stages GC_ST_EVEN) may be substantially the same as or similar to the first compensation gate stage GC_ST1. Therefore, duplicate descriptions will be omitted.

In the second compensation gate stage GC_ST2, the first clock input terminal CIN1 may be connected to the second-first clock signal line CLKL2-1, and the second clock input terminal CIN2 may be connected to the first-first clock signal line CLKL1-1.

FIG. 9 may be referred to signals describe operations of the first compensation gate stage GC_ST1 and the second compensation gate stage GC_ST2.

Figure 10A:
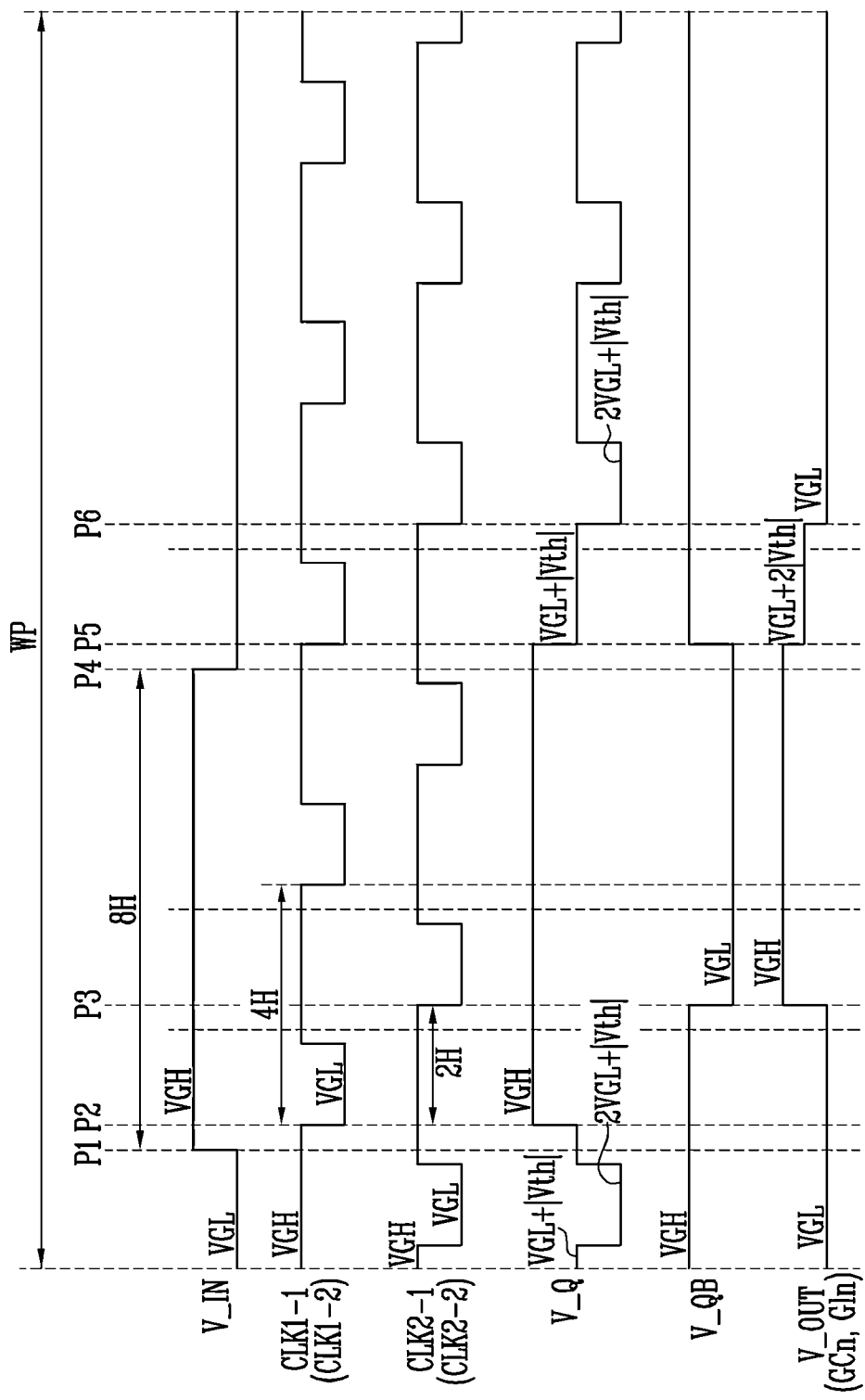
FIG. 10A is a waveform diagram illustrating an example of signals measured during a scan period in the first compensation gate stage of FIG. 9.

FIG. 10A is a waveform diagram illustrating an example of signals measured during a scan period in the first compensation gate stage of FIG. 9. FIG. 10B is a waveform diagram illustrating an example of signals measured during a blank period in the first compensation gate stage of FIG. 9. The operations of the first compensation gate stage GC_ST1 and the second compensation gate stage GC_ST2 may be substantially the same as or similar to each other. Therefore, the operation of the first compensation gate stage GC_ST1 will be described to include the operations of the first compensation gate stage GC_ST1 and the second compensation gate stage GC_ST2.

Referring to FIGS. 9 and 10A, during the scan period WP, waveforms of the first-first clock signal CLK1-1 and the first-second clock signal CLK1-2 may be the same, and waveforms of the second-first clock signal CLK2-1 and the second-second clock signal CLK2-2 may be the same.

First, the first-first clock signal CLK1-1 applied to the first clock input terminal CIN1 may have a first logic low level and a logic high level in a cycle of 4 horizontal periods 4H. Here, the first logic low level may correspond to a gate-on voltage level for turning on the P-type transistor, and may be the same as a voltage level of the second gate power source voltage VGL. The logic high level may correspond to a gate-off voltage level for turning off the P-type transistor, and may be the same as a voltage level of the first gate power source voltage VGH.

The second-first clock signal CLK2-1 applied to the second clock input terminal CIN2 may have a waveform in which the first-first clock signal CLK1-1 is delayed by a half cycle (that is, by 2 horizontal periods 2H).

At a first time point P1, an input voltage V_IN (for example, the start signal) at the input terminal IN0 may change from the first logic low level to the logic high level. For example, the input voltage V_IN may be maintained at the logic high level for 8 horizontal periods 8H.

At the first time point P1, a second node voltage V_Q at the second control node Q may have a second logic low level, the second node voltage V_Q at the first control node QB may have the logic high level, and an output voltage V_OUT (that is, the first compensation gate signal) at the output terminal OUT may have the logic low level. Here, the second logic low level may have a voltage level similar to the first logic low level. For example, the second logic low level may have a voltage level higher than the second gate power source voltage VGL by a threshold voltage Vth of a transistor (that is, the second logic low level is VGL+|Vth|. |Vth| is an absolute value of the threshold voltage Vth.).

At a second time point P2, the first-first clock signal CLK1-1 may transition from the logic high level to the first logic low level.

In this case, the first transistor M1 may be turned on in response to the first-first clock signal CLK1-1 of the first logic low level, and the input voltage V_IN of the logic high level may be applied to the first electrode of the twelfth transistor M12. Since the twelfth transistor M12 is turned on by the second gate power source voltage VGL, the input voltage V_IN of the logic high level may be applied to the second control node Q through the twelfth transistor M12. That is, the second node voltage V_Q may be changed to have the logic high level.

In addition, the fifth transistor M5 may be turned on in response to the first-first clock signal CLK1-1 of the first logic low level, and the second gate power source voltage VGL may be applied to the first electrode of the eleventh transistor M11. Since the eleventh transistor M11 is turned on by the second gate power source voltage VGL, the second gate power source voltage VGL may be applied to the first electrode of the second capacitor C2. The seventh transistor M7 may be turned on in response to the second gate power source voltage VGL (that is, the second gate power source voltage VGL applied to the first electrode of the second capacitor C2), and the second-first clock signal CLK2-1 of the logic high level may be applied to the second electrode of the second capacitor C2. Accordingly, a voltage corresponding to a difference between the logic high level and the first logic low level may be charged in the second capacitor C2.

The second transistor M2 may be turned on in response to the second gate power source voltage VGL, and the first gate power source voltage VGH may be applied to the second electrode of the third capacitor C3. Since the first electrode of the third capacitor C3 is connected to the second control node Q and the second node voltage V_Q has the logic high level, the third capacitor C3 may be discharged.

At a third time point P3, the second-first clock signal CLK2-1 may transition from the logic high level to the first logic low level.

In this case, the sixth transistor M6 may be turned on in response to the second-first clock signal CLK2-1 of the first logic low level, and the second-first clock signal CLK2-1 of the first logic low level may be applied to the first control node QB through the transistor M7 turned on by the second capacitor C2 and the sixth transistor M6 turned on. That is, a first node voltage V_QB may be changed to have the first logic low level.

The ninth transistor M9 may be turned on in response to the first node voltage V_QB of the first logic low level, and the first gate power source voltage VGH may be applied to the output terminal OUT through the first power source input terminal IN1 and the ninth transistor M9. That is, the output voltage V_OUT may be changed to have the logic high level.

As shown in FIG. 9, the output voltage V_OUT (that is, the first compensation gate signal) of the first compensation gate stage GC_ST1 may be applied to the first compensation gate line GCL1.

Thereafter, even when the first control node QB is in a floating state due to changes in the first-first clock signal CLK1-1 and the second-first clock signal CLK2-1, the first node voltage V_QB may be maintained at the first logic low level by the first capacitor C1, and the output voltage V_OUT may be maintained at the logic high level.

At a fourth time point P4, the input voltage V_IN may change from the logic high level to the first logic low level.

At a fifth time point P5, the first-first clock signal CLK1-1 may transition from the logic high level to the first logic low level.

In this case, the first transistor M1 may be turned on in response to the first-first clock signal CLK1-1 of the first logic low level, and the input voltage V_IN of the first logic low level may be applied to the first electrode of the twelfth transistor M12. Since the twelfth transistor M12 is turned on by the second gate power source voltage VGL, the input voltage V_IN of the first logic low level may be applied to the second control node Q through the twelfth transistor M12. By a threshold voltage of the twelfth transistor M12, the second node voltage V_Q may be changed to have the second logic low level (that is, VGL+|Vth|).

The tenth transistor M10 may be turned on in response to the second node voltage V_Q of the second logic low level, and the second gate power source voltage VGL may be applied to the output terminal OUT. By the second node voltage V_Q of the second logic low level and a threshold voltage of the tenth transistor M10, the output voltage V_OUT may be changed to have a fourth voltage level (that is, VGL+2|Vth|).

Meanwhile, the fourth transistor M4 may be turned on by the input voltage V_IN of the first logic low level provided through the first transistor M1. In addition, the fifth transistor M5 may be turned on in response to the first-first clock CLK1-1 of the first logic low level, and the second gate power source voltage VGL (and the first-first clock signal CLK1-1) may be applied to the gate electrode of the second transistor M2.

The second transistor M2 may be turned on in response to the second gate power source voltage VGL, and the first gate power source voltage VGH may be applied to the second electrode of the third capacitor C3.

Meanwhile, the eighth transistor M8 may be turned on by the input voltage V_IN of the first logic low level, and the first gate power source voltage VGH may be applied to the first control node QB. That is, the first node voltage V_QB may be changed to have the logic high level.

At a sixth time point P6, the second-first clock signal CLK2-1 may transition from the logic high level to the first logic low level.

Since the third transistor M3 is turned on by the second node voltage V_Q, the second-first clock signal CLK2-1 of the first logic low level may be applied to the second electrode of the third capacitor C3. The second node voltage V_Q may be boosted by the third capacitor C3, and the second node voltage V_Q may be changed to have a third logic low level. In addition, the output voltage V_OUT may be changed to have the first logic low level in response to the second node voltage V_Q of the third logic low level. Here, the third logic low level may have a voltage level lower than the first logic low level. For example, the third logic low level may have a voltage level lower than the second logic low level by the second gate power source voltage VGL (that is, 2VGL+|Vth|).

As described with reference to FIGS. 9 and 10A, the first compensation gate stage GC_ST1 may output the first gate power source voltage VGH as the output voltage V_OUT (that is, the first compensation gate signal) in response to a waveform in which the input voltage V_IN (that is, the start signal) is delayed by a half cycle of the second-first clock signal CLK2-1.

Next, referring to FIGS. 10A and 10B, the output voltage V_OUT (that is, the first compensation gate signal) may be maintained at the first logic low level during the blank period BP. That is, as described above with reference to FIG. 6, during the blank period BP, the initialization gate signal Gin and the compensation gate signal GCn of the turn-off level (logical low level) may be supplied to the display panel 50.

When the display device 1 is driven in the second display mode (in other words, low power display mode), a cycle of the first-first clock signal CLK1-1 in the blank period BP may be longer than a cycle of the first-first clock signal CLK1-1 in the scan period WP. Due to this, during the blank period BP, in the first-first clock signal CLK1-1 and the second-first clock signal CLK2-1, since the number of toggling between the logic high level and the logic low level decreases, power consumption can be reduced. For example, the cycle of the first-first clock signal CLK1-1 in the blank period BP may be twice (that is, 8 horizontal periods 8H) as long as the cycle of the first-first clock signal CLK1-1 in the scan period WP. Similarly, the cycle of the second-first clock signal CLK2-1 in the blank period BP may be twice (that is, 8 horizontal periods 8H) as long as the cycle of the second-first clock signal CLK2-1 in the scan period WP. In this case, the second-first clock signal CLK2-1 may be a waveform in which the first-first clock signal CLK1-1 is delayed by a half cycle (that is, by 4 horizontal periods 4H). However, a ratio at which a cycle of the clock signals increases in the blank period BP compared to the scan period WP is not limited thereto. As will be described later in FIG. 12, the ratio may increase as long as the turn-off level of the output voltage V_OUT (that is, the first compensation gate signal) does not exceed a predetermined size.

Even during the blank period BP as in the scan period WP, the waveform of each of the first-first clock signal CLK1-1 and the second-first clock signal CLK2-1 of the first compensation gate driver GCDV1 may be the same as the waveform of each of the first-second clock signal CLK1-2 and the second-second clock signal CLK2-2 of the second compensation gate driver GCDV2.

As shown in FIG. 10B, in an ideal case, the output voltage V_OUT (that is, the first compensation gate signal) should be maintained at the turn-off level (logical low level) during the blank period BP. However, as described above with reference to FIG. 6, the turn-off level of the output voltage V_OUT (that is, the first compensation gate signal) may rise due to the coupling phenomenon caused by various signals provided to the display panel 50 and/or the leakage current occurred in the turned-off state of some transistors included in the compensation gate stage. Hereinafter, a cause of the rise in the turn-off level of the output voltage V_OUT (that is, the first compensation gate signal) of the compensation gate driver GCDV will be described in detail with reference to FIG. 11.

Figure 11:
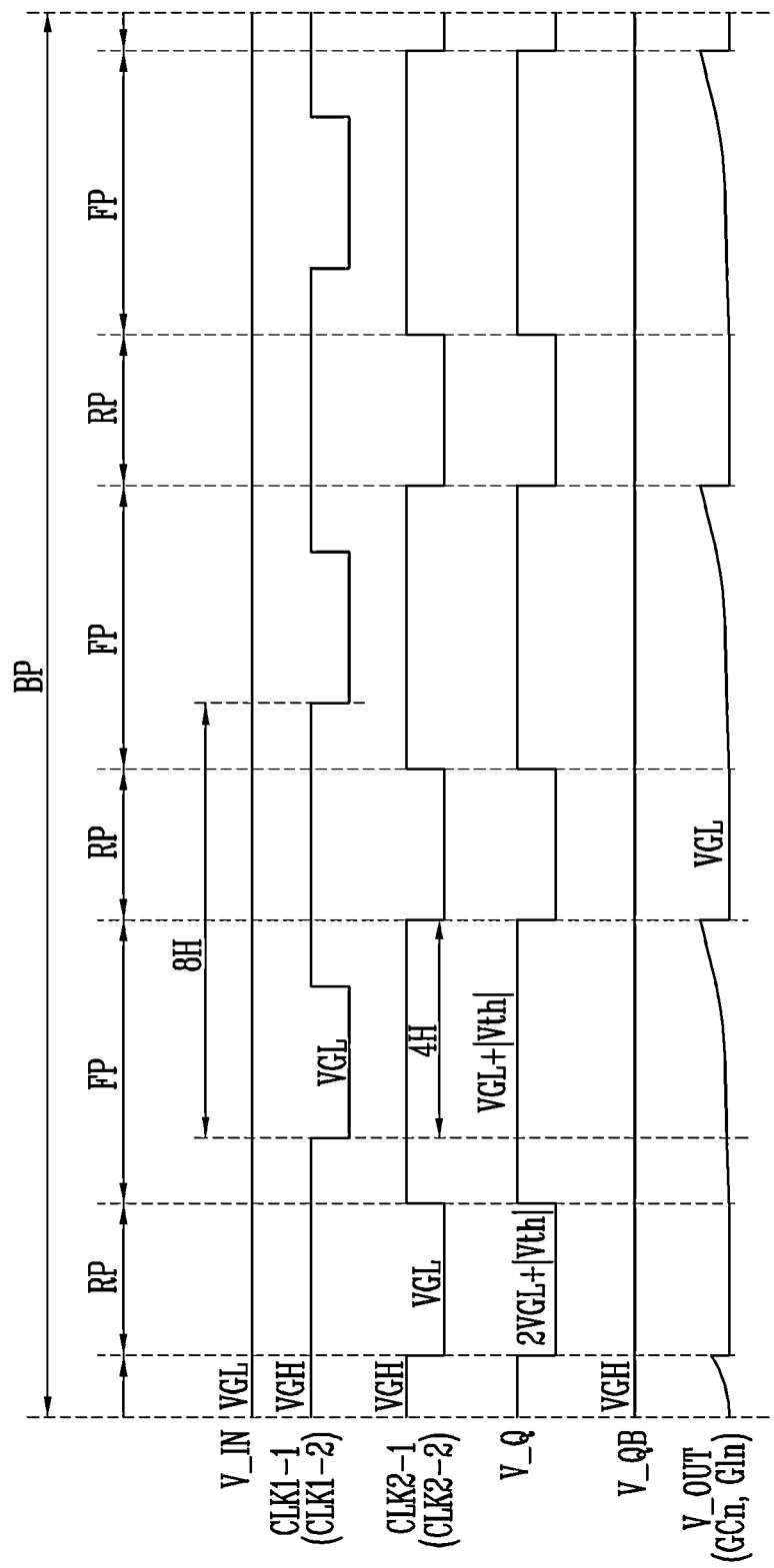
FIG. 11 is a diagram for explaining a cause of a rise in a turn-off level of a compensation gate signal output from a compensation gate driver according to the prior art.

FIG. 11 is a diagram for explaining a cause of a rise in a turn-off level of a compensation gate signal output from a compensation gate driver according to the prior art.

Referring to FIGS. 9 and 11, in a case of the odd-numbered compensation stages GC_ST_ODD of the first and second compensation gate drivers GCDV1 and GCDV2, the blank period BP may be divided into a refresh period RP and a floating period FP based on a change in the voltage level of the second-first clock signal CLK2-1 (or the second-second clock signal CLK2-2). Here, the refresh period RP may be a period in which the second node voltage V_Q of the second control node Q has the third logic low level (that is, 2VGL+|Vth|), and the floating period FP may be a period in which the second node voltage V_Q of the second control node Q has the second logic low level (that is, VGL+|Vth|). Meanwhile, in a case of the even-numbered compensation stages GC_ST_EVEN, the blank period BP may be divided into the refresh period RP and the floating period FP based on a change in the voltage level of the first-first clock signal CLK1-1 and the first-second clock signal CLK1-2.

As described above with reference to FIGS. 9 and 10A, after the sixth time point P6 shown in FIG. 10A, when the voltage level of the second-first clock signal CLK2-1 (or the second-second clock signal CLK2-2) transitions to the first logic low level (that is, VGL), since the third transistor M3 is turned on by the second node voltage V_Q, the second-first clock signal CLK2-1 of the first logic low level may be applied to the second electrode of the third capacitor C3. The second node voltage V_Q may be boosted by the third capacitor C3, and the second node voltage V_Q may be changed to have the third logic low level.

Since the gate electrode of the tenth transistor M10 shown in FIG. 9 is connected to the second control node Q, the tenth transistor M10 may be turned on or turned off in response to the second node voltage V_Q. Since the tenth transistor M10 is the P-type transistor, when the first logic low level (that is, VGL) is applied to the gate electrode, the tenth transistor M10 may be turned on.

Accordingly, the turned-on state of the tenth transistor M10 may not be satisfactory during the floating period FP in which the second node voltage V_Q has the second logic low level (that is, VGL+|Vth|) higher than the turn-on level (in other words, the first logic low level). On the other hand, the turned-on state of the tenth transistor M10 may be good during the refresh period RP in which the second node voltage V_Q has the third logic low level (that is, 2VGL+|Vth|) lower than the turn-on level (in other words, the first logic low level).

Meanwhile, when the display device 1 is driven in the second display mode (in other words, low power display mode), the cycle of the second-first clock signal CLK2-1 (or second-second clock signal CLK2-2) in the blank period BP may be longer than the cycle of the second-first clock signal CLK2-1 (or second-second clock signal CLK2-2) in the scan period WP. Due to this, since the floating period FP also increases, the voltage level (or the turn-off level of the first compensation gate signal) of the output voltage V_OUT of the compensation gate driver GCDV may rise corresponding to the length of the floating period FP. As a result, the amount of leakage current generated in the turn-off state of the third transistor T3 and the fourth transistor T4 shown in FIG. 2 may also increase. Hereinafter, a driving method for preventing the rise in the turn-off level of the output voltage V_OUT (that is, the first compensation gate signal) of the compensation gate driver GCDV will be described with reference to FIG. 12.

Figure 12:
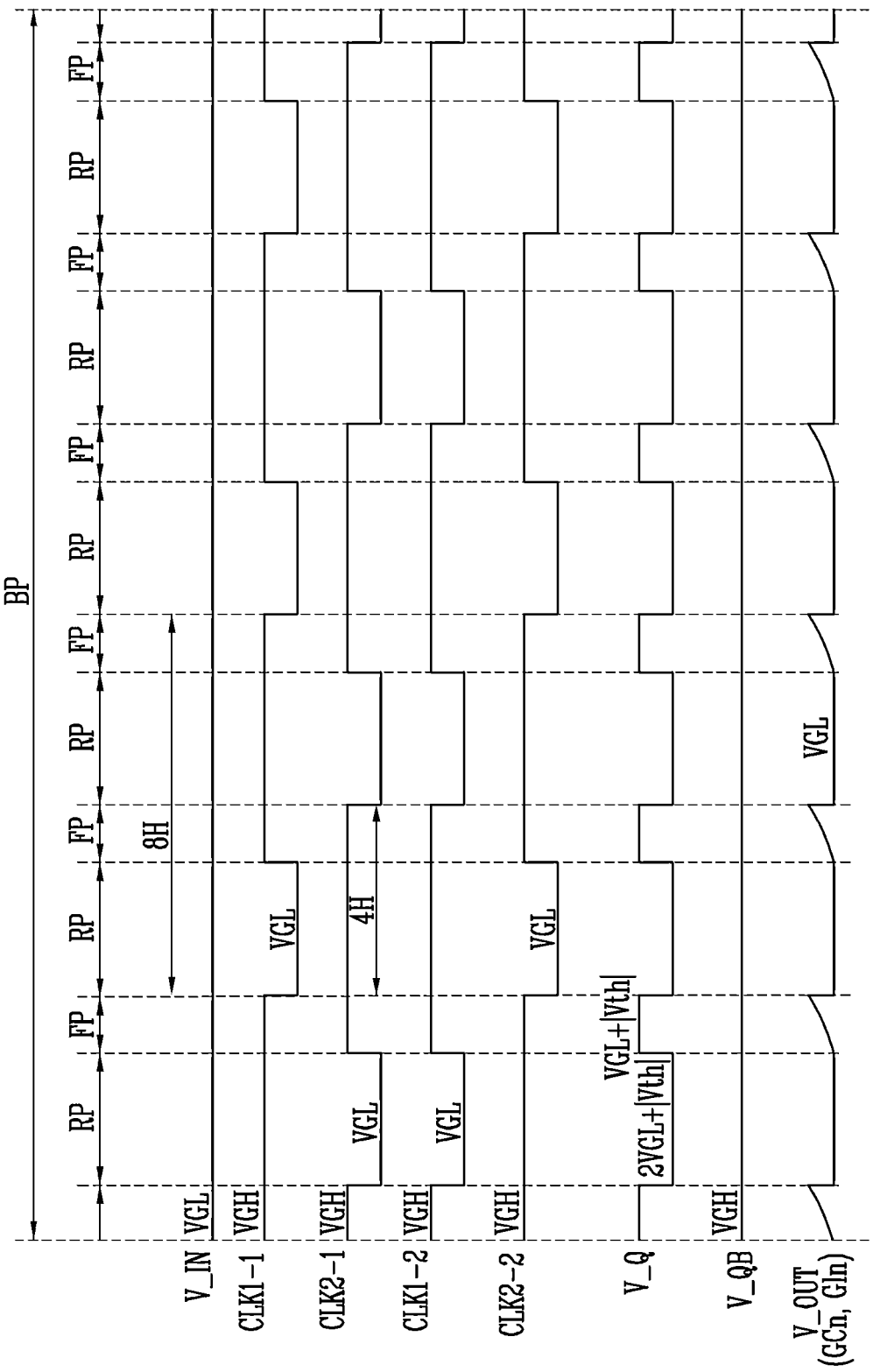
FIG. 12 is a diagram for explaining a driving method of a compensation gate driver during a blank period according to an embodiment of the present invention.

FIG. 12 is a diagram for explaining a driving method of a compensation gate driver during a blank period according to an embodiment of the present invention.

First, during the scan period WP, since the first and second compensation gate drivers GCDV1 and GCDV2 (see FIG. 7) may be operated in the same manner as the driving method described above with reference to FIG. 10A, duplicate descriptions will be omitted.

Referring to FIG. 12, according to the embodiment of FIG. 11, the waveforms of the clock signals CLK1-1 and CLK2-1 supplied to the first compensation gate driver GCDV1 and the waveforms of the clock signals CLK1-2 and CLK2-2 supplied to the second compensation gate driver GCDV2 may be the same during the blank period BP. However, according to the present embodiment, waveforms of the clock signals CLK1-1 and CLK2-1 supplied to the first compensation gate driver GCDV1 and waveforms of the clock signals CLK1-2 and CLK2-2 supplied to the second compensation gate driver GCDV2 may be different from each other during the blank period BP.

According to an embodiment of the present invention, during the scan period WP in which the compensation gate signal GCn (or the initialization gate signal GIn) is supplied to the display panel 50, the first-first clock signal CLK1-1 and the second-first clock signal CLK2-1 may have the same waveform as the first-second clock signal CLK1-2 and the second-second clock signal CLK2-2, respectively.

Meanwhile, during the blank period BP in which the compensation gate signal GCn (or the initialization gate signal GIn) is not supplied to the display panel 50, the first-first clock signal CLK1-1 and the second-first clock signal CLK2-1 may have different waveforms from the first-second clock signal CLK1-2 and the second-second clock signal CLK2-2, respectively. For example, during the blank period BP, the first-first clock signal CLK1-1 supplied to the first compensation gate driver GCDV1 may be a waveform in which the first-second clock signal CLK1-2 supplied to the second compensation gate driver GCDV2 is delayed by a half cycle (for example, by 4 horizontal periods 4H). Similarly, the second-first clock signal CLK2-1 supplied to the first compensation gate driver GCDV1 may be a waveform in which the second-second clock signal CLK2-2 supplied to the second compensation gate driver GCDV2 is delayed by a half cycle (for example, by 4 horizontal periods 4H).

As described above, during the blank period BP, the second-first clock signal CLK2-1 supplied to the first compensation gate driver GCDV1 may be supplied as a waveform in which the second-second clock signal CLK2-2 supplied to the second compensation gate driver GCDV2 is delayed by a half cycle (for example, by 4 horizontal periods 4H). Therefore, a period in which the voltage level of the second-first signal CLK2-1 is a first logic low does not overlap in time with a period in which the voltage level of the second-second signal CLK2-2 is the first logic low, so that the number of refresh periods RP may increase.

As described above, in the case of the odd-numbered compensation stages GC_ST_ODD (see FIG. 9) of the first and second compensation gate drivers GCDV1 and GCDV2, the blank period BP may be divided into the refresh period RP and the floating period FP based on a change in the voltage level of the second-first clock signal CLK2-1 and the second-second clock signal CLK2-2. Here, the refresh period RP may be a period in which the second node voltage V_Q of the second control node Q has the third logic low level (that is, 2VGL+|Vth|), and the floating period FP may be a period in which the second node voltage V_Q of the second control node Q has the second logic low level (that is, VGL+|Vth|). In other words, a case in which any one of the voltage levels of the second-first clock signal CLK2-1 and the second-second clock signal CLK2-2 is the first logic low level may correspond to the refresh period RP, and a case in which both the voltage levels of the second-first clock signal CLK2-1 and the second-second clock signal CLK2-2 are logic high levels may correspond to the floating period FP.

Meanwhile, in the case of the even-numbered compensation stages GC_ST_EVEN (see FIG. 9), the blank period BP may be divided into the refresh period RP and the floating period FP based on a change in the voltage level of the first-first clock signal CLK1-1 and the first-second clock signal CLK1-2.

As described above with reference to FIGS. 9 and 10A, after the sixth time point P6 shown in FIG. 10A, when voltage levels of the second-first clock signal CLK2-1 and the second-second clock signal CLK2-2 transition to the first logic low level (that is, VGL), since the third transistor M3 is turned on by the second node voltage V_Q, the second-first clock signal CLK2-1 of the first logic low level may be applied to the second electrode of the third capacitor C3. The second node voltage V_Q may be boosted by the third capacitor C3, and the second node voltage V_Q may be changed to have the third logic low level.

Since the gate electrode of the tenth transistor M10 shown in FIG. 9 is connected to the second control node Q, the tenth transistor M10 may be turned on or turned off in response to the second node voltage V_Q. Since the tenth transistor M10 is the P-type transistor, when the first logic low level (that is, VGL) is applied to the gate electrode, the tenth transistor M10 may be turned on.

Accordingly, the turned-on state of the tenth transistor M10 may not be satisfactory during the floating period FP in which the second node voltage V_Q has the second logic low level (that is, VGL+|Vth|) higher than the turn-on level (in other words, the first logic low level). On the other hand, the turned-on state of the tenth transistor M10 may be good during the refresh period RP in which the second node voltage V_Q has the third logic low level (that is, 2VGL+|Vth|) lower than the turn-on level (in other words, the first logic low level).

As described above, due to an increase in the refresh period RP (or a decrease in the floating period FP) during the blank period BP, a period during which the voltage level of the output voltage V_OUT of the compensation gate driver GCDV (or the turn-off level of the first compensation gate signal) rises may decrease compared to the embodiment shown in FIG. 11. Accordingly, a rising width of the voltage level (or the turn-off level of the first compensation gate signal) of the output voltage V_OUT during the blank period BP may also decrease. As a result, the amount of leakage current generated in the turned-off state of the third transistor T3 and the fourth transistor T4 shown in FIG. 2 may also decrease.

In the display device according to the present invention, timings of the clock signals provided to the first and second gate drivers connected to one pixel may be controlled differently during the blank period. Accordingly, during the blank period, the compensation gate signal output from the gate driver to control the initialization transistor and the compensation transistor may be maintained at the turn-off level.

However, the effects of the present invention are not limited to the above-described effects, and may be variously extended without departing from the spirit and scope of the present invention.

The above detailed description is intended to illustrate and describe the present invention. In addition, the above description is only to show and describe preferred embodiments of the present invention. As described above, the present invention can be used in various other combinations, changes and environments. Changes or modifications may be made thereto within the scope of the concept of the invention disclosed in the present specification, the scope equivalent to the disclosed contents, and/or the skill or knowledge of the art. Therefore, the detailed description of the invention is not intended to limit the invention to the disclosed embodiments. In addition, the appended claims should be construed as including other embodiments.

What is claimed is:

1. A display device comprising:
   a display panel including pixels connected to compensation gate lines; and
   a compensation gate driver which supplies compensation gate signals to the display panel,
   wherein the compensation gate driver comprises:
      a first compensation gate driver which generates the compensation gate signals based on a first-first clock signal and a second-first clock signal and
      a second compensation gate driver which generates the compensation gate signals based on a first-second clock signal and a second-second clock signal, and
   wherein the first-first clock signal and the second-first clock signal have a same waveform as the first-second clock signal and the second-second clock signal, respectively, during a scan period in which a compensation gate signal of the compensation gate signal is supplied to the display panel, and have different waveforms from the first-second clock signal and the second-second clock signal, respectively, during a blank period in which the compensation gate signal is not supplied to the display panel.

2. The display device of claim 1, wherein in the blank period, the first-first clock signal has a waveform in which the first-second clock signal is delayed by a half cycle, and the second-first clock signal has a waveform in which the second-second clock signal is delayed by a half cycle.

3. The display device of claim 1, wherein a cycle of each of the first-first clock signal, the second-first clock signal, the first-second clock signal, and the second-second clock signal is longer in the blank period than in the scan period.

4. The display device of claim 1, wherein the first compensation gate driver and the second compensation gate driver sequentially generate the compensation gate signals of a turn-on level during the scan period, and maintain the compensation gate signals at a turn-off level during the blank period.

5. The display device of claim 1, wherein the compensation gate lines each have one end connected to the first compensation gate driver and an opposite end connected to the second compensation gate driver, and the compensation gate signals are simultaneously applied to the compensation gate lines from opposite sides of the display panel.

6. The display device of claim 1, wherein each of the pixels includes:
   a light emitting diode;
   a first-first transistor connected between a first power source and the light emitting diode;
   a second-first transistor connected between a data line and a first electrode of the first-first transistor;
   a third-first transistor connected between a gate electrode of the first-first transistor and a second electrode of the first-first transistor and having a gate electrode connected to a compensation gate line of the compensation gate lines;
   a fourth-first transistor connected between the gate electrode of the first-first transistor and an initialization power source and having a gate electrode connected to an initialization gate line; and
   a storage capacitor connected between the first power source and the gate electrode of the first-first transistor.

7. The display device of claim 6, further comprising:
   a fifth-first transistor connected between the first power source and the first electrode of the first-first transistor and having a gate electrode connected to an emission gate line; and
   a sixth-first transistor connected between the second electrode of the first-first transistor and an anode electrode of the light emitting diode and having a gate electrode connected to the emission gate line.

8. The display device of claim 7, further comprising:
   a seventh-first transistor connected between the initialization power source and the anode electrode of the light emitting diode and having a gate electrode connected to a bypass gate line.

9. The display device of claim 8, wherein the third-first transistor and the fourth-first transistor are oxide semiconductor transistors.

10. The display device of claim 6, wherein the compensation gate line is a current compensation gate line, and the initialization gate line is a previous compensation gate line.

11. The display device of claim 1, further comprising:
    data lines connected to the pixels; and
    a data driver which supplies a data signal to the pixels through the data lines.

12. The display device of claim 1, wherein the compensation gate driver includes a plurality of stages which provides the compensation gate signals to the compensation gate lines, and
    wherein a stage of the plurality of stages includes:
       a node control unit which controls a voltage of a first control node; and
       an output unit which outputs a first gate power source voltage supplied from a first power source input terminal as the compensation gate signal in response to the voltage of the first control node.

13. The display device of claim 12, wherein the output unit includes:
    a pull-up transistor including a first electrode connected to the first power source input terminal, a second electrode connected to an output terminal, and a gate electrode connected to the first control node; and
    a pull-down transistor including a first electrode connected to the output terminal, a second electrode connected to a second power source input terminal which supplies a second gate power source voltage, and a gate electrode connected to a second control node.

14. The display device of claim 13, further comprising:
    a first clock signal line, a second clock signal line, and a start signal line;
    wherein the node control unit includes:
       a first transistor including a first electrode connected to the start signal line, a second electrode, and a gate electrode connected to the first clock signal line;

a second transistor including a first electrode connected to the first power source input terminal, a second electrode, and a gate electrode;

a third transistor including a first electrode connected to the second electrode of the second transistor, a second electrode connected to the second clock signal line, and a gate electrode connected to the second control node;

a fourth transistor including a first electrode connected to the gate electrode of the second transistor, a second electrode connected to the first clock signal line, and a gate electrode connected to the second electrode of the first transistor;

a fifth transistor including a first electrode connected to the first electrode of the fourth transistor, a second electrode connected to the second power source input terminal, and a gate electrode connected to the first clock signal line;

a first coupling transistor including a first electrode connected to the first electrode of the fifth transistor, a second electrode, and a gate electrode connected to the second power source input terminal;

a first coupling capacitor including a first electrode connected to the second electrode of the first coupling transistor and a second electrode;

a sixth transistor including a first electrode connected to the first control node, a second electrode connected to the second electrode of the first coupling capacitor, and a gate electrode connected to the second clock signal line; and a seventh transistor including a first electrode connected to the second electrode of the first coupling capacitor, a second electrode connected to the second clock signal line, and a gate electrode connected to the first electrode of the first coupling capacitor.

15. The display device of claim 14, wherein the node control unit further includes:

a second coupling capacitor including a first electrode connected to the second electrode of the second transistor and a second electrode connected to the gate electrode of the third transistor; and a second coupling transistor including a first electrode connected to the second electrode of the first transistor, a second electrode connected to the second control node, and a gate electrode connected to the second power source input terminal.

16. The display device of claim 15, wherein the blank period includes:

a refresh period in which a signal having a voltage level lower than a turn-off level of the pull-down transistor is provided to the second control node; and a floating period in which a signal having a voltage level higher than the turn-off level of the pull-down transistor is provided to the second control node.

17. The display device of claim 16, wherein an odd-numbered stage among the stages is in the refresh period when any one of voltage levels of the second-first clock signal and the second-second clock signal supplied through the second clock signal line during the blank period is at a logic low level, and in the floating period when both the voltage levels of the second-first clock signal and the second-second clock signal supplied through the second clock signal line during the blank period are at a logic high level.

18. The display device of claim 16, wherein an even-numbered stage among the stages is in the refresh period when any one of voltage levels of the first-first clock signal and the first-second clock signal supplied through the first clock signal line during the blank period is at a logic low level, and in the floating period when both the voltage levels of the first-first clock signal and the first-second clock signal supplied through the first clock signal line during the blank period are at a logic high level.

* * * * *